United States Patent
Jang et al.

(10) Patent No.: US 9,773,566 B2
(45) Date of Patent: Sep. 26, 2017

(54) NONVOLATILE MEMORY DEVICE AND STORAGE DEVICE HAVING THE SAME

(71) Applicant: SAMSUNG ELECTRONICS CO., LTD., Suwon-si, Gyeonggi-do (KR)

(72) Inventors: Dong-Su Jang, Seongnam-si (KR); Taesung Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/403,923

(22) Filed: Jan. 11, 2017

(65) Prior Publication Data

US 2017/0125115 A1  May 4, 2017

Related U.S. Application Data

(62) Division of application No. 14/600,366, filed on Jan. 20, 2015, now Pat. No. 9,576,626.

(30) Foreign Application Priority Data

May 30, 2014  (KR) ........................ 10-2014-0065921

(51) Int. Cl.
*G11C 16/32* (2006.01)
(52) U.S. Cl.
CPC .................... *G11C 16/32* (2013.01)
(58) Field of Classification Search
CPC .................................................. G11C 8/12
USPC .................................................. 365/230.02
See application file for complete search history.

(56) References Cited

U.S. PATENT DOCUMENTS

| | | | |
|---|---|---|---|
| 6,101,136 A | 8/2000 | Mochida | |
| 6,101,596 A | 8/2000 | Tanaka et al. | |
| 6,266,273 B1 | 7/2001 | Conley et al. | |
| 6,442,627 B1 * | 8/2002 | Negishi | G06F 5/10 |
| | | | 703/14 |
| 6,772,312 B2 | 8/2004 | Mes | |
| 6,778,464 B2 | 8/2004 | Chung | |
| 7,069,406 B2 | 6/2006 | Hronik | |
| 7,388,417 B2 | 6/2008 | Kim et al. | |
| 7,423,927 B2 | 9/2008 | Kim et al. | |
| 7,461,199 B2 | 12/2008 | Conley et al. | |
| 7,464,282 B1 | 12/2008 | Abdollahi-Alibeik | |
| 7,580,319 B2 | 8/2009 | Kim et al. | |
| 7,679,133 B2 | 3/2010 | Son et al. | |
| 8,176,354 B2 | 5/2012 | Jacobson | |
| 8,225,016 B2 | 7/2012 | Rashid | |

(Continued)

OTHER PUBLICATIONS

Daeyeal Lee et al., "A 64Gb 533Mb/s DDR Interface MLC NAND Flash in Sub-20nm Technology", ISSCC 2012 / Session 25 / Non-Volatile Memory Solutions / 25.5, p. 430-432.

*Primary Examiner* — Hoai V Ho
*Assistant Examiner* — Muna A Techane
(74) *Attorney, Agent, or Firm* — Volentine & Whitt, PLLC

(57) ABSTRACT

A nonvolatile memory device includes a data path; and a FIFO memory including a plurality of registers connected to the data path. The plurality of registers sequentially receive data from the data path in response to data path input clocks and sequentially output the received data to an input/output pad in response to data path output clocks. The data path output clocks are clocks that are generated by delaying the data path input clocks as long as a delay time.

10 Claims, 23 Drawing Sheets

(56) References Cited

U.S. PATENT DOCUMENTS

| | | | |
|---|---|---|---|
| 8,527,802 B1 * | 9/2013 | Tran | G11C 7/1006 |
| | | | 711/1 |
| 8,553,466 B2 | 10/2013 | Han et al. | |
| 8,559,235 B2 | 10/2013 | Yoon et al. | |
| 8,595,459 B2 | 11/2013 | Ware et al. | |
| 8,601,231 B2 | 12/2013 | Mes | |
| 8,654,587 B2 | 2/2014 | Yoon et al. | |
| 8,667,368 B2 | 3/2014 | Gupta et al. | |
| 2007/0091691 A1 | 4/2007 | Faue et al. | |
| 2007/0234143 A1 | 10/2007 | Kim | |
| 2011/0233648 A1 | 9/2011 | Seol et al. | |
| 2012/0151124 A1 * | 6/2012 | Baek | G06F 12/0246 |
| | | | 711/103 |
| 2012/0224408 A1 * | 9/2012 | Yan | G11C 7/1006 |
| | | | 365/148 |
| 2014/0215294 A1 * | 7/2014 | Kim | G11C 17/02 |
| | | | 714/819 |

\* cited by examiner

NONVOLATILE MEMORY DEVICE AND STORAGE DEVICE HAVING THE SAME

CROSS-REFERENCE TO RELATED APPLICATIONS

This is a Divisional of U.S. application Ser. No. 14/600,366, filed Jan. 20, 2015, now U.S. Pat. No. 9,576,626 issued on Feb. 21, 2017, which makes a claim of priority under 35 U.S.C. §119 to Korean Patent Application No. 10-2014-0065921, filed on May 30, 2014, the subject matter of which is incorporated by reference herein in its entirety.

TECHNICAL FIELD

The present inventive concept relates generally to a nonvolatile memory and a storage including the same, and more particular, to a nonvolatile memory and a storage having a pipeline data path

DISCUSSION OF THE RELATED ART

In typical pipeline architectures, since pipe registers are scattered in a chip, margin must be secured with respect to each point where a pipe register exists. If the margin on at least one point is insufficient, overall performance of the pipeline may be influenced by the at least one point.

Due to a memory characteristic, in a read operation, a clock signal is transferred in an array direction and data is transferred in an input/output pin direction. That is, a transfer direction of the clock signal and a transfer direction of the data are opposite to each other. If a clock point in time is changed to secure margin of one point, a point in time when data arrives may be changed at a next stage. This makes it difficult to tune margin. Also, now that the number of pipe stages increases with an increase in operating speed, the degree of difficulty on design increases more and more.

SUMMARY

One aspect of embodiments of the inventive concept is directed to provide a nonvolatile memory device comprising a data path having a wave pipeline architecture; a plurality of data path input clocks; a plurality of data path output clocks; and a FIFO memory configured to store data transmitted to the data path in response to the plurality of data path input clocks and output the stored data to an input/output pad in response to the plurality of data path output clocks.

In exemplary embodiments, the data path input clocks are generated using an internal clock.

In exemplary embodiments, the FIFO memory includes a plurality of registers, and the nonvolatile memory device further comprises a data path input clock generator configured to generate the data path input clocks to be provided to the plurality of registers, respectively.

In exemplary embodiments, the nonvolatile memory device further comprises a delay trim circuit configured to delay the internal clock as long as a predetermined time, and the delayed internal clock output from the delay trim circuit is provided to the data path input clock generator.

In exemplary embodiments, the nonvolatile memory device further comprises a data path output clock generator configured to count a latency of the internal clock as long as a delay time and generate the plurality of data path output clocks provided to the plurality of registers using the internal clock delayed as long as the delay time.

In exemplary embodiments, the plurality of registers are disposed to be clustered at one of the input/output pads.

In exemplary embodiments, the nonvolatile memory device further comprises an internal clock generator configured to generate the internal clock as long as a latency of the pipeline architecture.

In exemplary embodiments, each of the plurality of registers comprises a latch; a first transmission circuit configured to connect the data path to the latch in response to one of the plurality of data path input clocks and an inverted version of the one data path input clock; and a second transmission circuit configured to output data of the latch to the input/output pad in response to one of the plurality of data path output clocks and an inverted version of the one data path output clock.

In exemplary embodiments, the nonvolatile memory device further comprises compare logic connected to the data path and configured to compare data on the data path with expected data.

Another aspect of embodiments of the inventive concept is directed to provide a nonvolatile memory device comprising a memory cell array; a plurality of page buffers connected to the memory cell array through bit lines; and a pipeline output stage connected to the plurality of page buffers through data lines, wherein the pipeline output stage comprises a plurality of first pipeline output stages each including a plurality of first registers connected to the plurality of page buffers in a wave pipeline architecture; a data multiplexer configured to select one of data from the plurality of first pipeline output stages; and at least one second pipeline output stage including a plurality of second registers connected to the data multiplexer in the wave pipeline architecture.

In exemplary embodiments, the nonvolatile memory device further comprises compare logics connected between the first pipeline output stages and the data multiplexer and configured to compare output data of the first pipeline output stages with expected data.

In exemplary embodiments, each compare logic checks integrity of data transmitted to at least one of the data lines.

In exemplary embodiments, the at least one second pipeline output stage is connected to input/output pads.

In exemplary embodiments, the plurality of second registers are disposed to be scattered at the input/output pads.

In exemplary embodiments, the pluralities of second registers are disposed to be clustered at one of the input/output pads.

In exemplary embodiments, the nonvolatile memory device further comprises a data multiplexer connected to the input/output pads and configured to receive data through data lines separated from registers of the second pipeline output stages and transmit one of the received data to the input/output pads in response to a data mux signal.

In exemplary embodiments, the nonvolatile memory device further comprises an internal clock generator configured to use an external clock as an internal clock and generate the internal clock during a time interval corresponding to a latency of the pipeline output stage.

In exemplary embodiments, the nonvolatile memory device further comprises at least one latency counter configured to count a latency of the internal clock; and a clock multiplexer configured to use one of output clocks from the first pipeline output stages as an input clock of the at least one second pipeline output stage.

In exemplary embodiments, the nonvolatile memory device further comprises a clock input selector configured to determine whether to provide the internal clock to one of the first pipeline output stages, based on an array selection signal.

Still another aspect of embodiments of the inventive concept is directed to provide a storage device comprising a data path having a wave pipeline architecture; a plurality of different data path input clocks; a plurality of different data path output clocks; a plurality of registers each configured to store data transmitted to the data path in response to the plurality of different data path input clocks and output the stored data to an input/output pad in response to the plurality of different data path output clocks; a plurality of pipeline output stages connected to the plurality of registers; and a memory controller configured to activate the plurality of registers selectively according to a high-speed mode or a low-speed mode.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
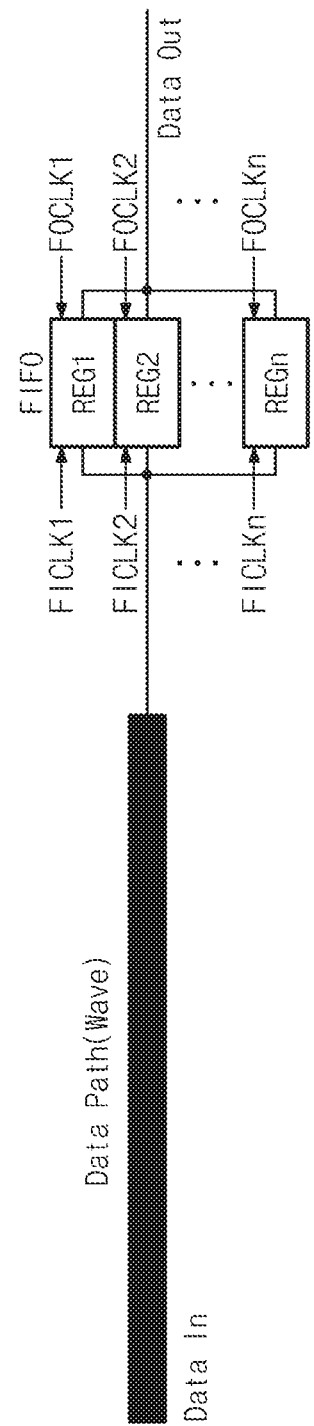
FIG. 1 is a diagram for describing the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a diagram for describing the inventive concept. Referring to FIG. 1, a nonvolatile memory device according to an embodiment of the inventive concept may include a pipeline output stage that has at least one data path for transmitting data using a wave pipeline mechanics. Herein, the wave pipeline mechanics means a way where different data are sequentially transmitted to a data path with an interval of time (or, a time lag). That is, when different data are sequentially transmitted, each of the different data may be stored in a FIFO (First-In First-Out) memory or buffers (registers) in the time that each of the different data is transmitted because, the data path is not divided with a storage element, such as a register or a latch, in the middle. A plurality of registers REG1 to REGn included in the FIFO memory may sequentially store data from the data path in response to a first data path input clocks FICLK1 to FICLKn (n being an integer of 2 or more) and sequentially output the stored data in response to a first data path output clocks FOCLK1 to FOCLKn.

At a point in time when the first data path input clocks FICLK1 to FICLKn and the first data path output clocks FOCLK1 to FOCLKn are different from one another, the plurality of registers REG1 to REGn may selectively store data provided from the data path and output the stored data to a next stage of the data path in a time interval.

The first data path input clocks FICLK1 to FICLKn may be produced using an internal clock. Herein, the internal clock may be a clock provided from the outside of the nonvolatile memory device or a clock that the nonvolatile memory device generates. Also, the first data path output clocks FOCLK1 to FOCLKn may be delayed clocks of the first data path input clocks FICLK1 to FICLKn, and the delayed clocks are used to compensate for a delay time corresponding to the data path.

The nonvolatile memory device according to an exemplary embodiment of the inventive concept may be formed of, but not limited to, a NAND flash memory device, a NOR flash memory device, a Resistive Random Access Memory (RRAM) device, a Phase-Change Memory (PRAM) device, a Magnetoresistive Random Access Memory (MRAM) device, a Ferroelectric Random Access Memory (FRAM) device, or a Spin Transfer Torque Random Access Memory (STT-RAM) device. Also, the nonvolatile memory device may be implemented to have a three-dimensional array structure. In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Not only is the inventive concept applicable to a flash memory device, in which a charge storage layer is made up of a conductive floating gate, but it is also applicable to a Charge Trap Flash (CTF) memory device, in which a charge storage layer is made up of an insulation film. Below, for the sake of easy understanding, the nonvolatile memory device is a NAND flash memory device.

Figure 2:
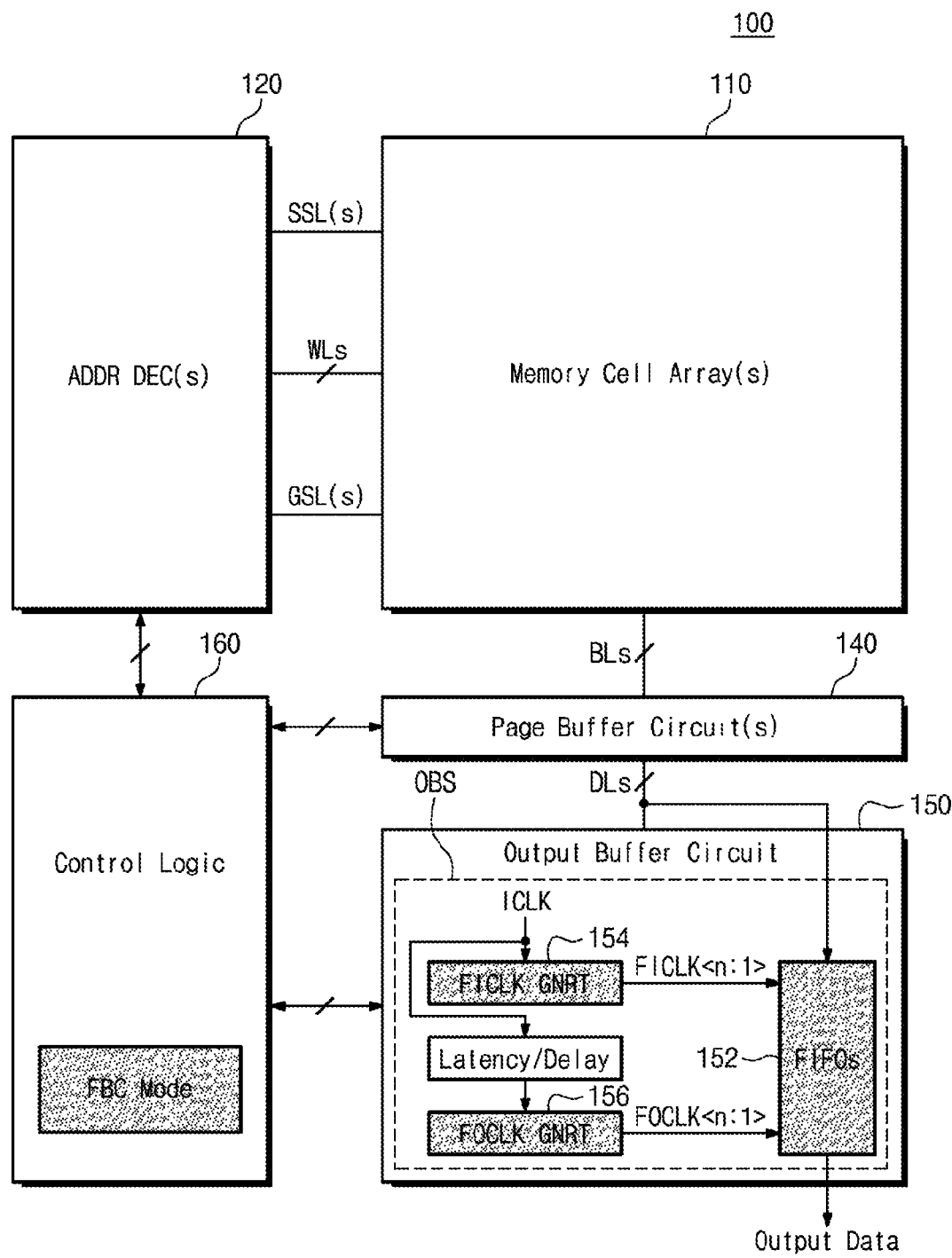
FIG. 2 is a schematic block diagram illustrating a nonvolatile memory device according to an embodiment of the inventive concept.

FIG. 2 is a schematic block diagram illustrating a nonvolatile memory device according to an exemplary embodiment of the inventive concept. Referring to FIG. 2, a nonvolatile memory device 100 may include at least one memory cell array 110, at least one address decoder 120, at least one page buffer circuit 140, an output buffer circuit 150, and control logic 160.

The memory cell array 110 may include a plurality of memory blocks. For the sake of easy understanding, only one memory block is illustrated in FIG. 2. Each memory block may be connected to the address decoder 120 via word lines, at least one string selection line SSL, and at least one ground selection line GSL and to the page buffer circuit 140 via bit lines.

The memory block may include a plurality of strings that are connected to the bit lines. Herein, each string may may include at least one string selection transistor, a plurality of memory cells, and at least one ground selection transistor that are connected in series between a bit line and a common source line. Each memory cell may store one or more bits. In exemplary embodiments, each string may further include at least one dummy cell between a string selection transistor and a plurality of memory cells and between a plurality of memory cells and a ground selection transistor.

The address decoder 120 selects one of the memory blocks in response to an address. The address decoder 120 is connected to the memory cell array 110 through the word lines, the at least on string selection line SSL, and the at least one ground selection line GSL. The address decoder 120 provides driving voltages to the word lines, the at least one string selection line SSL, and the at least one ground selection line GSL using a decoded row address. The address decoder 120 decodes a column address of an input address. Herein, the decoded column address may be transferred to the page buffer circuit 140. In exemplary embodiments, the address decoder 120 may include, but not limited to, a row decoder, a column decoder, an address buffer, and so on.

Although not shown in FIG. 2, the nonvolatile memory device 100 may further include a voltage generation circuit. The voltage generation circuit may generate the driving voltages, such as a program voltage, a pass voltage, a read voltage, a read pass voltage, a verification voltage, an erase operation, a common source line voltage, a well voltage, and so on. The voltage generation circuit may also generate voltages needed for a program/read/erase operation.

The page buffer circuit 140 is connected to the memory cell array 110 through the bit lines. The page buffer circuit 140 is configured to receive the decoded column address from the address decoder 120. The page buffer circuit 140 selects the bit lines using the decoded column address for connection with data lines DLs. Herein, the number of the data lines may be less than the number of the bit lines.

The page buffer circuit 140 may include a plurality of page buffers that store data to be programmed in a program operation and stores data read in a read operation. Herein, each of the page buffers may include a plurality of latches. During a program operation, data stored in the page buffers may be programmed at a page of a selected memory block. During a read operation, data read from a page of a selected memory block may be stored in the page buffers via the bit lines. Meanwhile, the page buffer circuit 140 reads data from a first area of the memory cell array 110 and then stores the read data in a second area of the memory cell array 110. For example, the page buffer circuit 140 may perform a copyback operation.

The data output buffer circuit 150 is connected to at least one page buffer circuit 140 through the data lines DLs. In a data output operation (e.g., a read operation), the output buffer circuit 150 may output data read by the page buffer circuit 140 to the external device. In exemplary embodiments, the output buffer circuit 150 may be implemented to have an asynchronous pipeline architecture.

In the data output operation, data may be output in a wave pipeline mechanics using FIFOs 152. That is, the page buffer circuit 140 may sequentially provide the data lines DLs with data, which is stored in the page buffer circuit 140, in the wave pipeline mechanics in response to a control signal provided together with a column address.

The FIFOs 152 sequentially receive data transmitted on the data lines DLs in response to a plurality of data path input clocks FICLK<n:1> (n being an integer of 2 or more). Also, the FIFOs 152 sequentially output data in response to a plurality of data path output clocks FOCLK<n:1>. A driving timing of a column address and the data path input clocks FICLK<n:1> may be mutually adjusted in the consideration of the delay time that output data is transmitted to the data lines DLs.

A data path input clock generator 154 generates the data path input clocks FICLK<n:1> using an internal clock ICLK. In exemplary embodiments, the internal clock ICLK may be generated by an external clock source that is provided from an external device (e.g., a memory controller). In other exemplary embodiments, the internal clock ICLK may be generated from an oscillator that is implemented in the nonvolatile memory device 100.

A data path output clock generator 156 generates the data path output clocks FOCLK<n:1> by adding a predetermined latency or delay from the internal clock ICLK.

The control logic 160 controls overall operations of the nonvolatile memory device 100, including, but not limited to, a program operation, a read operation, an erase operation, and so on. The control logic 160 may operate in response to control signals or commands that are provided from the external device.

The control logic 160 may support a fail bit count (FBC) mode in which fail bits are counted to secure integrity of output data transmitted to the data lines DLs. Fail bits are counted by comparing output data transmitted to the data lines DLs with expected data at the FBC mode. This is disclosed in U.S. Pat. No. 7,388,417 and U.S. Publication No. 2007-0234143, the disclosure of which is hereby incorporated by reference.

In exemplary embodiments, the FBC mode may be selectively executed according to a request of an external device. For example, the FBC mode may be activated in a high-speed read mode of operation; on the other hand, it may be inactivated in a low-speed read mode of operation.

In exemplary embodiments, the FBC mode may be activated only with respect to some column addresses.

The nonvolatile memory device 100 according to an embodiment of the inventive concept may perform a read operation at high speed using at least one data path with an asynchronous wave pipeline architecture. Also, the nonvolatile memory device 100 supports the FBC mode, thereby improving the reliability of output data.

Figure 3:
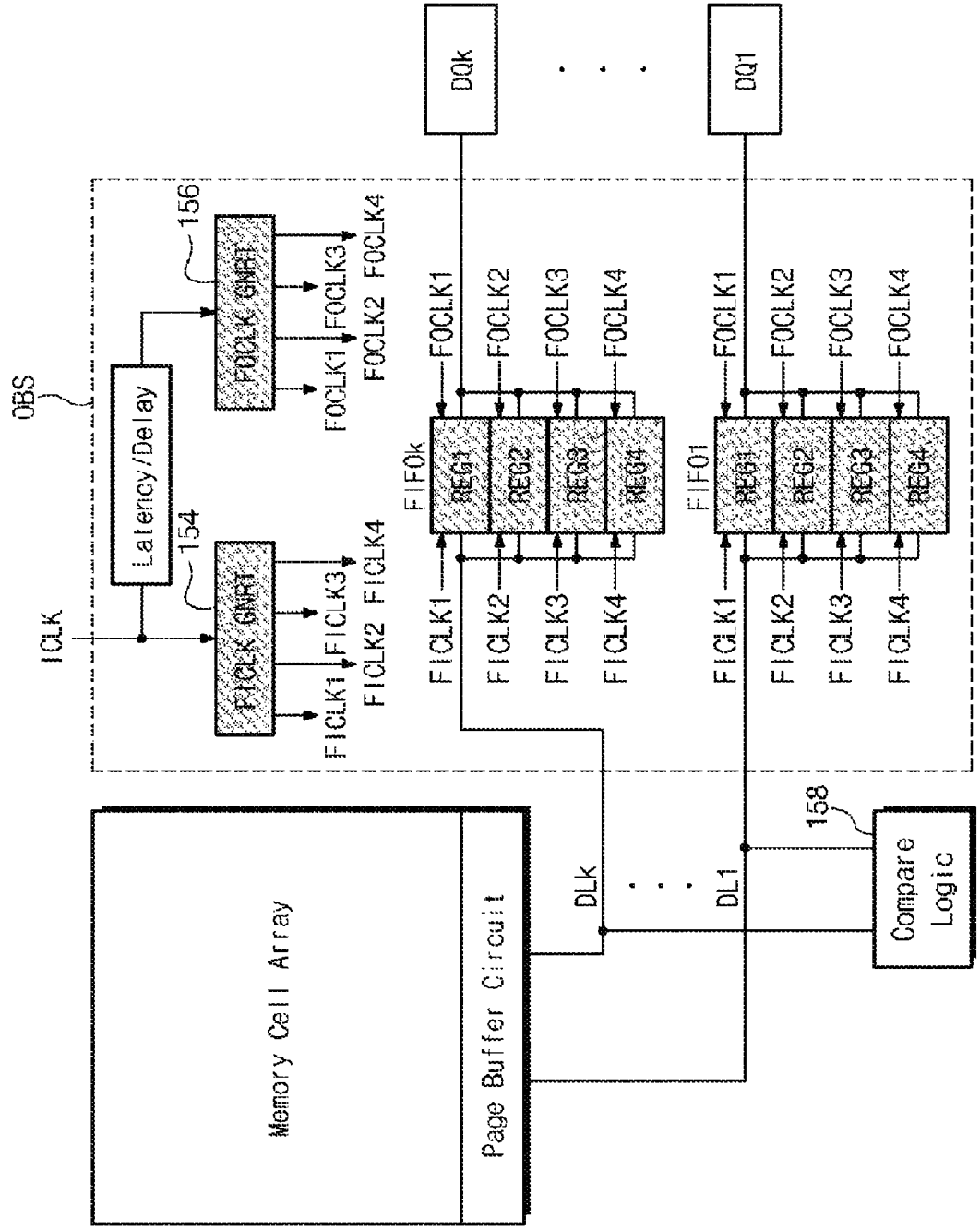
FIG. 3 is a schematic block diagram illustrating a pipeline output stage of an output buffer circuit, according to an embodiment of the inventive concept.

FIG. 3 is a schematic block diagram illustrating a pipeline output stage of an output buffer circuit 150, according to a first embodiment of the inventive concept. Referring to FIG. 3, a pipeline output stage OBS may include a plurality of FIFOs FIFO1 to FIFOk (k being an integer of 2 or more), a data path input clock generator 154, and a data path output clock generator 156.

The FIFOs FIFO1 to FIFOk are disposed between data lines DL1 to DLk and data pads DQ1 to DQk, respectively. For the sake of easy understanding, an embodiment of the inventive concept is exemplified as each FIFO is formed of four registers REG1 to REG4. However, the number of registers of each FIFO is not limited thereto.

In exemplary embodiments, the registers REG1 to REG4 all may be activated in a data output operation.

In other exemplary embodiments, the number of registers REG1 through REG4 activated may vary with an operating mode in a data output operation. For example, all registers REG1 through REG4 may be activated in a high-speed read mode of operation, and some of the registers REG1 through REG4 may be activated in a low-speed read mode of operation.

The registers REG1 through REG4 may sequentially latch data on the data lines DL1 to DLk in response to data path input clocks FICLK1 to FICLK4. Also, the registers REG1 through REG4 may sequentially output the latched data in response to data path output clocks FOCLK1 through FOCLK4. Here, the data path input clocks FICLK1 to FICLK4 may be produced from the data path input clock generator 154, and the data path output clocks FOCLK1 to FOCLK4 may be produced from the data path output clock generator 156.

Also, compare logic 158 may be connected to the data lines DL1 through DLk. The compare logic 158 compares data transmitted through the data lines DL1 to DLk with expected data to secure data integrity in a data output operation. An embodiment of the inventive concept is exemplified as the compare logic 158 checks integrity of data transferred through all data lines DL1 to DLk. However, the inventive concept is not limited thereto. For example, the compare logic 158 may check integrity of data transmitted through at least one of the data lines DL1 through DLk.

Figure 4:
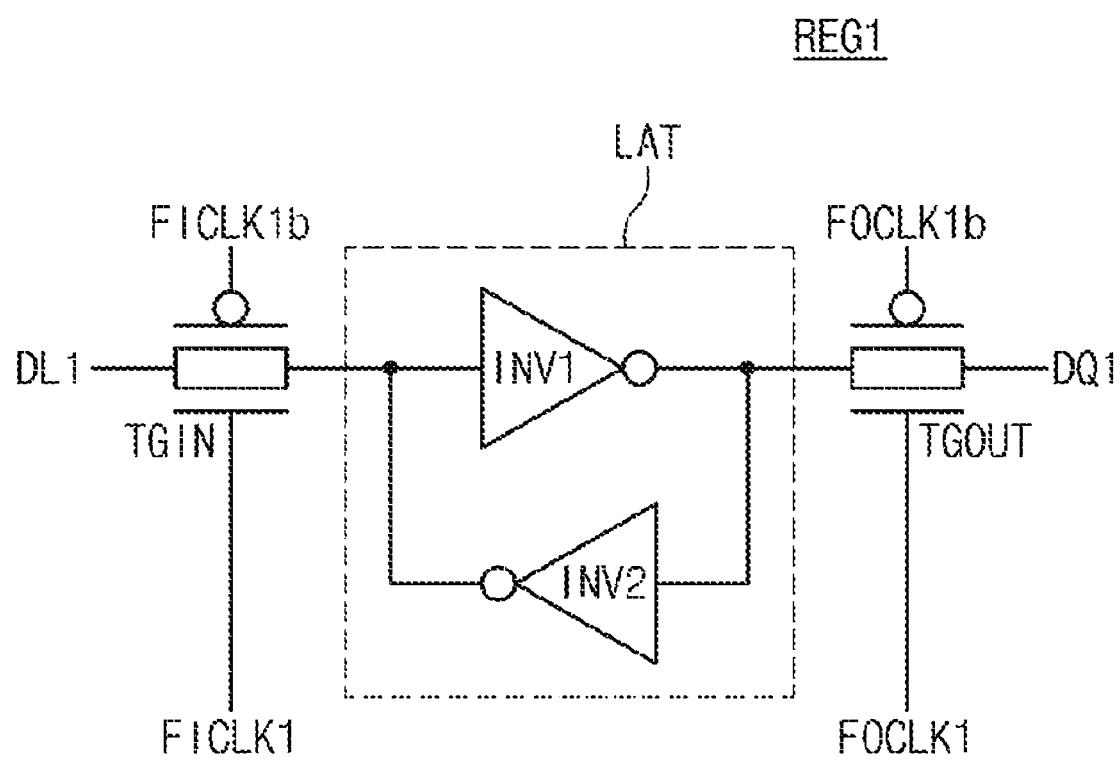
FIG. 4 is a schematic block diagram illustrating a register illustrated in FIG. 3.

FIG. 4 is a schematic block diagram illustrating a register REG1 shown in FIG. 3. Referring to FIG. 4, a register REG1 may include an input transmission gate circuit TGIN, an output transmission gate circuit TGOUT, and a latch LAT formed of a first inverter INV1 and a second inverter INV2. The input transmission gate circuit TGIN transmits data on a data line DL1 through the latch LAT in response to first data path input clocks FICLK1 and FICLK1b. The output transmission gate circuit TGOUT outputs data latched in the latch LAT to a data pad DQ1 in response to first data path output clocks FOCLK1 and FOCLK1b. Remaining registers REG2 to REG4 illustrated in FIG. 3 may be implemented the same as the register REG1 illustrated in FIG. 4.

In FIG. 3, there is illustrated the exemplary embodiment in which one pipeline output stage OBS exists between a page buffer circuit 140 and input/output pads DQ1 to DQk. However, the inventive concept is not limited thereto. A nonvolatile memory device according to an exemplary embodiment of the inventive concept may be implemented to include pipeline output stages formed of a plurality of pipeline steps (e.g., multi-step pipeline output stages).

Figure 5:
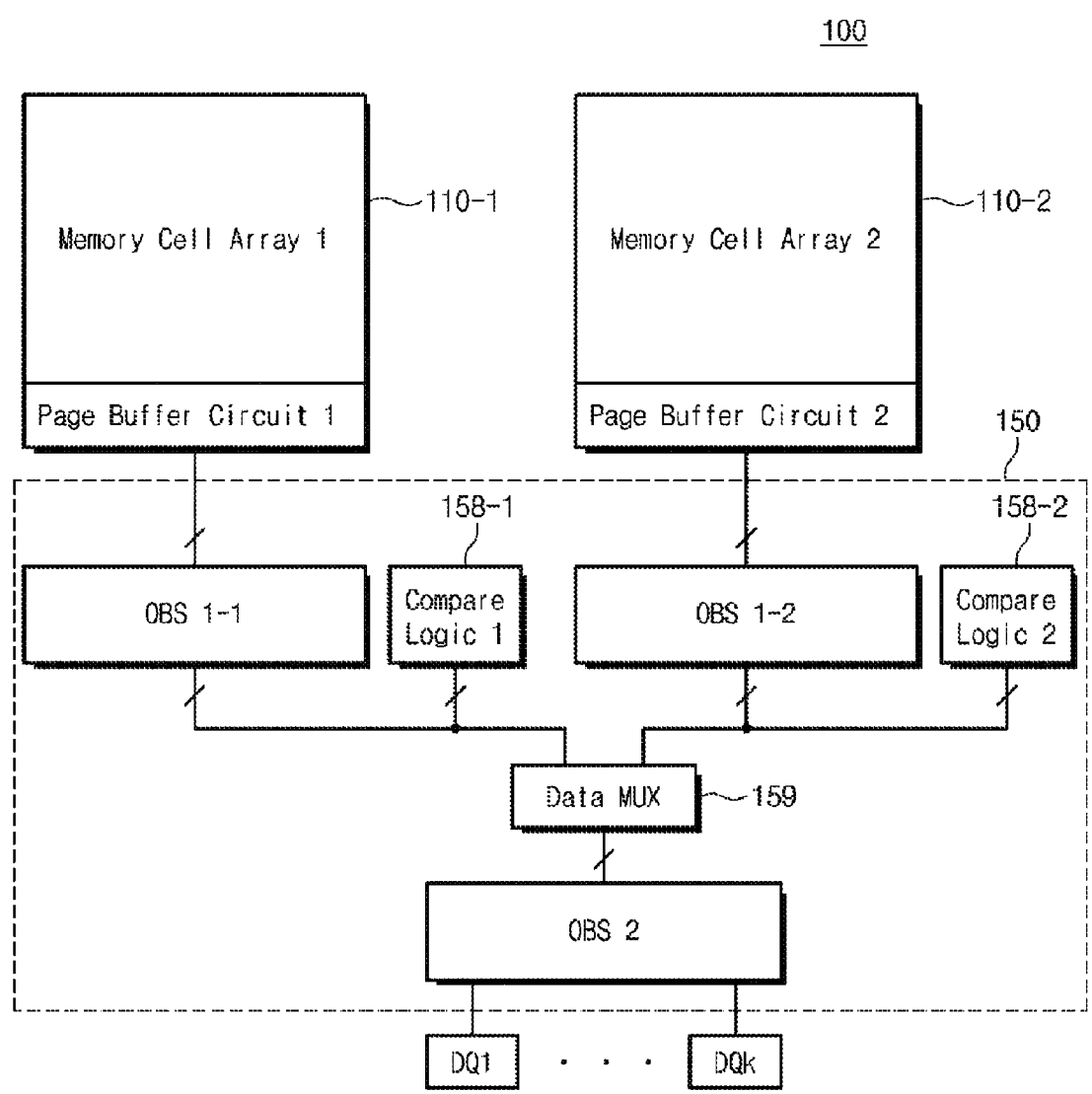
FIG. 5 is a schematic block diagram illustrating a pipeline output stage of an output buffer circuit, according to a second embodiment of the inventive concept.

FIG. 5 is a schematic block diagram illustrating a pipeline output stage of an output buffer circuit 150, according to a second embodiment of the inventive concept. Referring to FIG. 5, a nonvolatile memory device 100 may include two pipeline output stages OBS 1 and OBS 2 that are disposed between data lines DL1 to DLk and data pads DQ1 to DQk. Each of the pipeline output stages OBS 1 and OBS 2 may be implemented the same as a pipeline output stage OBS illustrated in FIG. 3.

As illustrated in FIG. 5, the output buffer circuit 150 may further comprise compare logics 158-1 and 158-2 and a data multiplexer 159. The compare logics 158-1 and 158-2 are used to secure integrity of data output from first pipeline output stages OBS 1-1 and OBS 1-2, and the data multiplexer 159 is disposed between the first pipeline output stages OBS 1-1 and OBS 1-2 and the second pipeline output stage OBS 2. The data multiplexer 159 transmits data from one of the first pipeline output stages OBS 1-1 and OBS 1-2 to the second pipeline output stage OBS 2 in response to an array selection signal.

In FIG. 5, there are illustrated pipeline output stages on only two memory cell arrays 110-1 and 110-2. However, the inventive concept is not limited thereto. For example, a nonvolatile memory device 100 according to an exemplary embodiment of the inventive concept may include three or more memory cell arrays.

Figure 6:
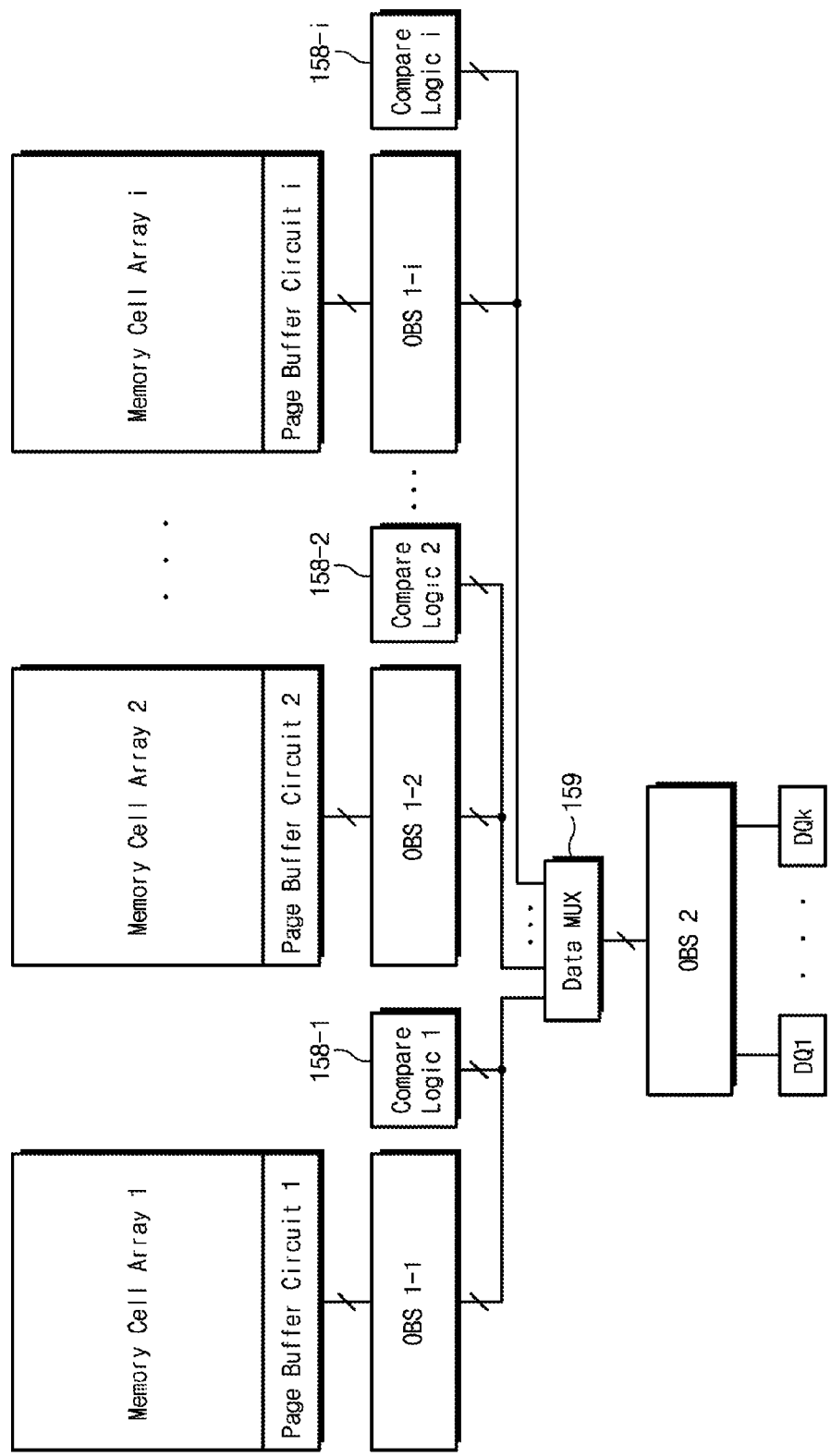
FIG. 6 is a schematic block diagram illustrating a pipeline output stage of an output buffer circuit, according to a third embodiment of the inventive concept.

FIG. 6 is a schematic block diagram illustrating a pipeline output stage of an output buffer circuit 150, according to a third embodiment of the inventive concept. Referring to FIG. 6, a pipeline output stage may include first pipeline output stages OBS 1-1 to OBS 1-*i* (i being an integer of 2 or more) of a first pipeline step and a second pipeline output stage OBS 2 of a second pipeline step.

In FIGS. 5 and 6, an embodiment of the inventive concept is exemplified as a pipeline output stage is formed of two pipeline steps. However, the inventive concept is not limited thereto. For example, a pipeline output stage of the inventive concept may be formed of three or more pipeline steps.

Figure 7:
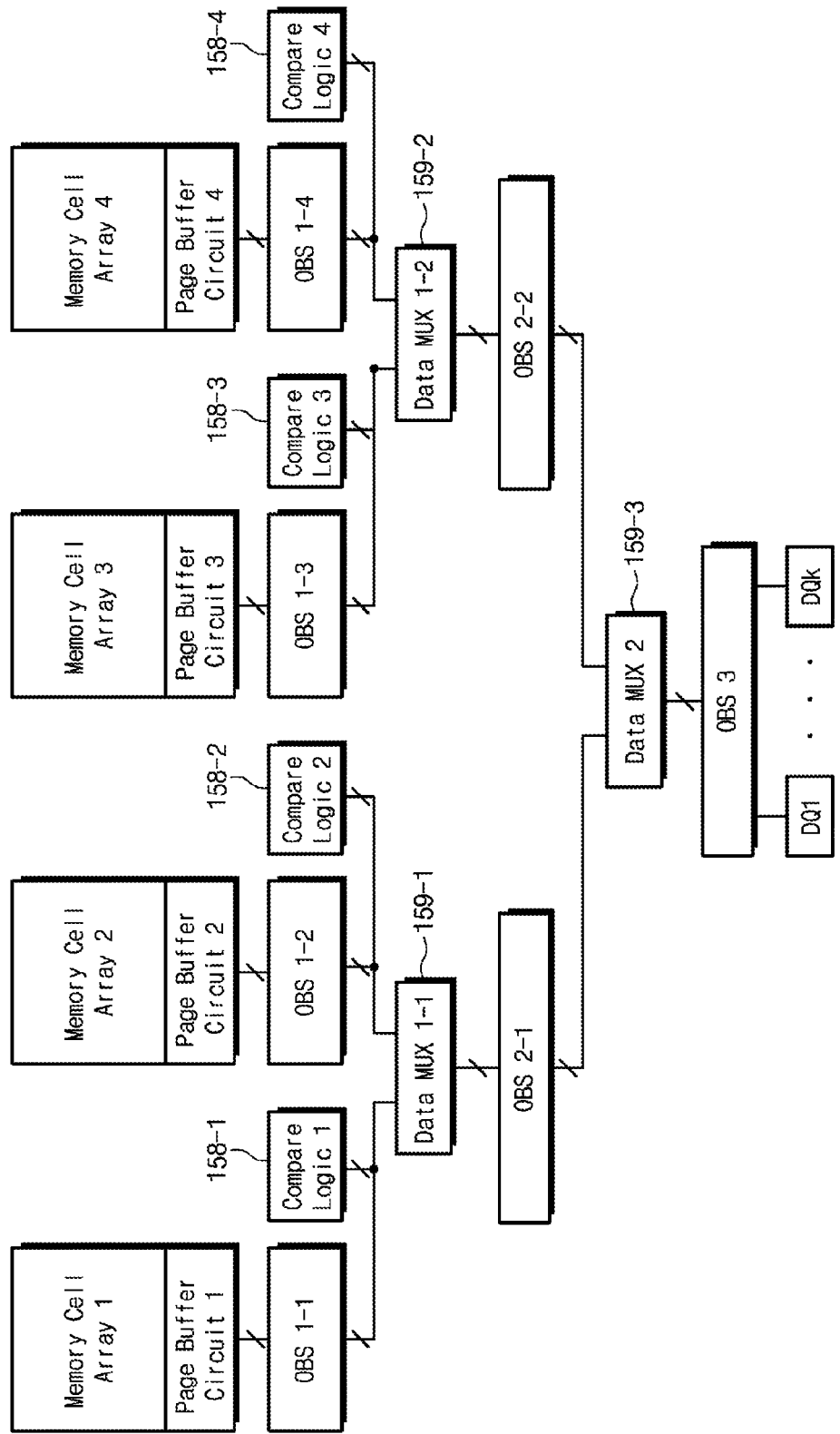
FIG. 7 is a schematic block diagram illustrating a pipeline output stage of an output buffer circuit, according to a fourth embodiment of the inventive concept.

FIG. 7 is a schematic block diagram illustrating a pipeline output stage of an output buffer circuit 150, according to a fourth embodiment of the inventive concept. Referring to FIG. 7, a pipeline output stage is formed of three pipeline steps. The first pipeline step may include first pipeline output stages OBS 1-1 to OBS 1-4 and compare logics 158-1 to 158-4. The second pipeline step is formed of data multiplexers 159-1 and 159-2 and second pipeline output stages OBS 2-1 and OBS 2-2. The third pipeline step is formed of a data multiplexer 159-3 and a second pipeline output stage OBS 3.

Meanwhile, the pipeline output stage of the inventive concept may further include an internal clock generator (not shown), which generates an internal clock ICLK (refer to FIG. 2), to compensate for delay of an external clock provided from an external device in a data output operation.

Figure 8:
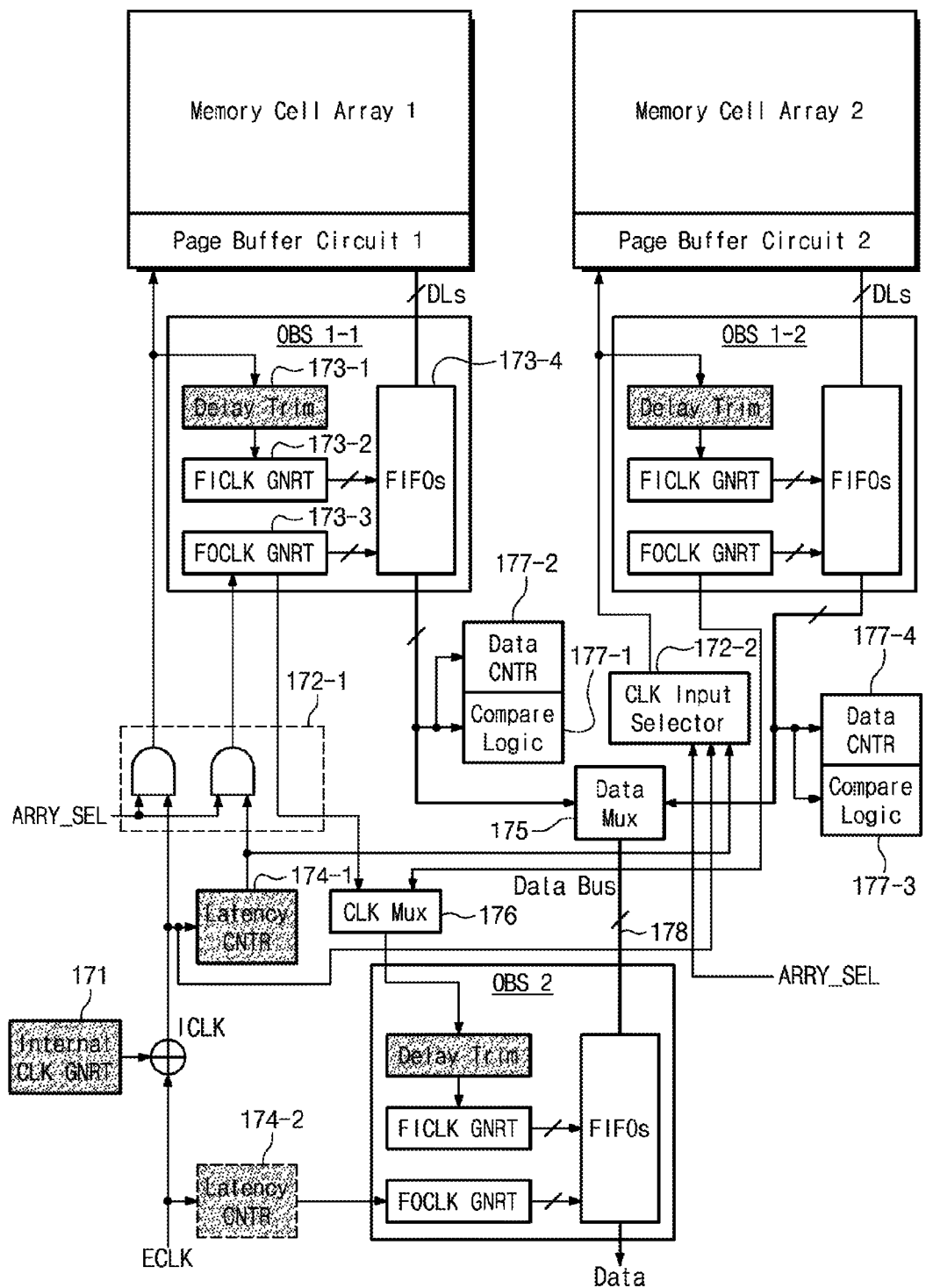
FIG. 8 is a schematic block diagram illustrating a pipeline output stage of an output buffer circuit, according to a fifth embodiment of the inventive concept.

FIG. 8 is a schematic block diagram illustrating a pipeline output stage of an output buffer circuit 150, according to a fifth embodiment of the inventive concept. Referring to FIG. 8, a nonvolatile memory device 100 has a 2-plane structure and may include first pipeline output stages OBS 1-1 and OBS 1-2, a second pipeline output stage OBS 2, an internal clock generator 171, clock input selectors 172-1 and 172-2 for selecting clocks to be provided to the respective planes, first and second latency counters 174-1 and 174-2 for counting latency of a clock, a data multiplexer 175, a clock multiplexer 176, compare logics 177-1 and 177-3, and data counters 177-2 and 177-4.

The first pipeline output stage OBS 1-1 may comprise a delay trim circuit 173-1, a data path input clock generator 173-2, a data path output clock generator 173-3, and a plurality of FIFOs 173-4. The delay trim circuit 173-1 makes fine delay on an input clock output from the clock input selector 172-1 and transmits the delayed clock to the data path input clock generator 173-2. The data path input clock generator 173-2 receives a clock output from the delay trim circuit 173-1 to generate data path input clocks FICLK<n:1> used to receive data sequentially from data lines DLs. The data path output clock generator 173-3 receives an output clock from the clock input selector 172-1 to generate data path output clocks FOCLK<n:1> used to output data sequentially from the FIFOs 173-4.

The pipeline output stage OBS 1-2 and the pipeline output stage OBS 2 may be configured the same as the pipeline output stage OBS 1-1.

The nonvolatile memory device 100 may internally produce an internal clock ICLK to be supplied to overall pipelines on the basis of a clock the internal clock generator 171 generates. Also, the nonvolatile memory device 100 may generate the internal clock ICLK on the basis of a clock generated from the internal clock generator 171 and an external clock ECLK.

Each of the clock input selectors 172-1 and 172-2 may be configured to select whether to provide the internal clock ICLK or a delayed clock to the first pipeline output stages OBS 1-1 and OBS 1-2 in response to an array selection signal ARRY_SEL. Here, the internal clock ICLK may be a clock generated based on the external clock ECLK provided from an external device or a clock that is produced on the basis of at least one of clocks from the internal clock generator 171.

Each of the latency counters 174-1 and 174-2 may delay an input clock ICLK by counting the input clock ICLK as many as predetermined numbers for generating latency and then provides the delayed input clock to each of the clock input selectors 172-1 and 172-2 as an output clock. In exemplary embodiments, the latency counter 174-2 may be skipped (or, bypassed).

The data multiplexer 175 transmits either output data of the pipeline output stage OBS 1-1 or output data of the pipeline output stage OBS 1-2 to a data bus 178. That is, the data bus 178 may be shared by a plurality of planes.

The clock multiplexer 176 selects one of an output clock of the pipeline output stage OBS 1-1 and an output clock of the pipeline output stage OBS 1-2 as an input clock of the second pipeline output stage OBS 2.

In a data output operation, the compare logic 177-1 determines whether output data of the first pipeline output stage OBS 1-1 is a fail bit. In the data output operation, the compare logic 177-3 determines whether output data of the first pipeline output stage OBS 1-2 is a fail bit. The data counters 177-2 and 177-4 count fail bits of output data of a page buffer circuit at a test operation.

A wave pipeline operation of the inventive concept is as follows. The internal clock ICLK arrives at registers FIFO at the same point in time as data. The internal clock ICLK is finely adjusted (or, tuned) by the delay trim circuit 173-1. When the adjusted internal clock arrives at the data path input clock generator 173-2, the data path input clocks FICLK<n:1> may be respectively provided to N registers from a first register to a Nth register. Thus, data is stored in registers FIFO in response to each of the data path input clocks FICLK<n:1>.

When an internal clock ICLK delayed by predetermined latency arrives at the data path output clock generator 173-3, the data path output clocks FOCLK<n:1> may be respectively provided to N registers from a first register to a Nth register. Thus, data stored in the registers FIFO is output in response to each of the data path output clocks FOCLK<n:1>.

A delay of each of the data path output clocks FOCLK<n:1> may be adjusted according to propagation delay time needed for data to arrive at a corresponding register. The degree of compensation for the propagation delay may be implemented by latency or delay.

Also, the data path output clocks FOCLK may be delayed according to an propagation time of data to a next step such that it is used as an input clock of the next step. Data path input/output clocks for a next pipeline output stage may be generated in the same way, and a data input/output operation may be performed in response to the data path input/output clocks thus generated.

In the inventive concept, a clock margin may determined by a relationship between arrival times of an input clock and data. To secure sufficient margin, it is necessary to make skew of data including a plural of data bits small.

Now that a nonvolatile memory device 100 according to an embodiment of the inventive concept may include an internal clock generator 171 independently, pipeline latency does not be exhibited to the outside. Also, an area of the nonvolatile memory device 100 according to an embodiment of the inventive concept may be reduced because memory cell arrays share a data bus by using a wave pipeline scheme.

Meanwhile, in FIG. 8, an output data path is formed of 2-step pipeline output stages from a page buffer circuit. However, the inventive concept is not limited thereto. For example, the output data path of the inventive concept may be formed of pipeline output stages of three or more steps. At least one of pipeline output stages is bypassed as necessary. For example, in a low-speed read mode of operation, some of pipeline output stages may be bypassed or latency may be adjusted with respect to some of pipeline output stages.

Below, a disposition of the last pipeline output stage will be described.

Figure 9:
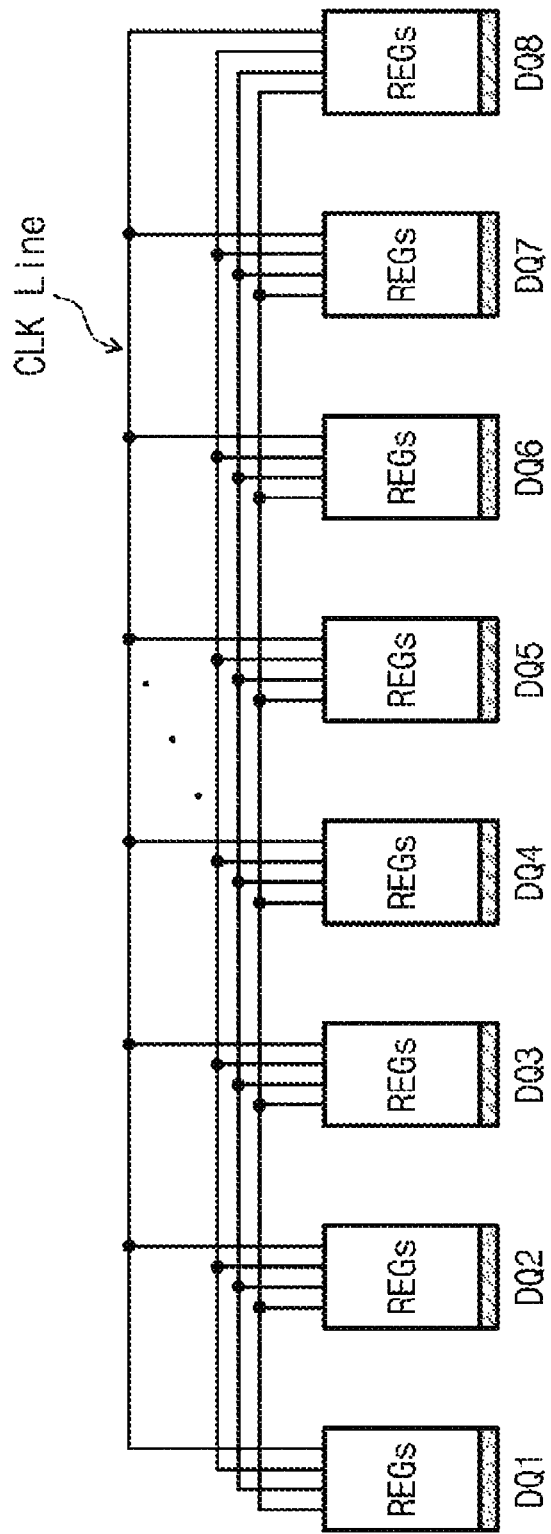
FIG. 9 is a diagram showing how registers of the last pipeline output stage are disposed, according to an embodiment of the inventive concept.

FIG. 9 is a diagram illustrating a disposition of the last pipeline output stage, according to an embodiment of the inventive concept. Referring to FIG. 9, registers of the last pipeline output stage may be disposed to be adjacent to input/output pads, respectively.

Figure 10:
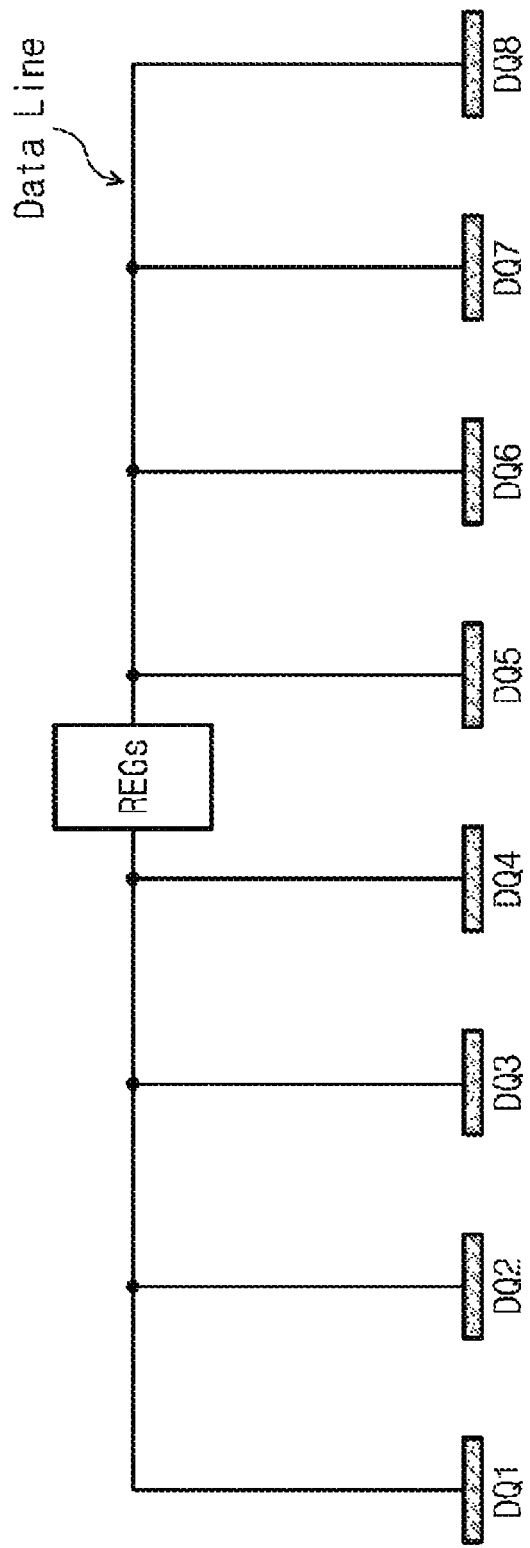
FIG. 10 is a diagram showing how registers of the last pipeline output stage are disposed, according to a second embodiment of the inventive concept.

FIG. 10 is a diagram illustrating a disposition of the last pipeline output stage, according to a second embodiment of the inventive concept. Referring to FIG. 10, registers of the last pipeline output stage may be disposed to be clustered at one of input/output pads DQ1 to DQ8, thereby resulting in a reduced length of a clock path to the registers to the last pipeline output stage.

Figure 11:
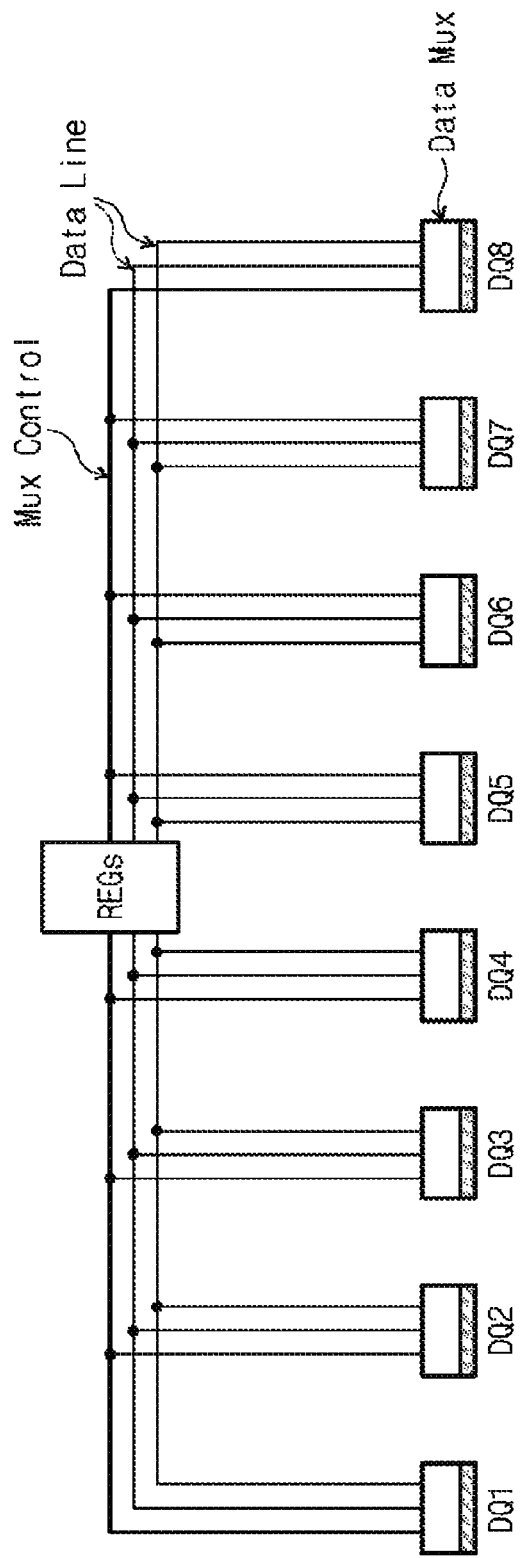
FIG. 11 is a diagram showing how registers of the last pipeline output stage are disposed, according to a third embodiment of the inventive concept.

FIG. 11 is a diagram showing how registers of the last pipeline output stage are disposed, according to a third embodiment of the inventive concept. Referring to FIG. 11, registers of the last pipeline output stage may be disposed to be clustered, and data multiplexers may be disposed to be adjacent to input/output pads DQ1 to DQ8, respectively. Each of the data multiplexers may connect one of a plurality of data lines to an input/output pad in response to a multiplexing control signal. With the above description, data skew may be reduced by focusing registers on any site.

Figure 12:
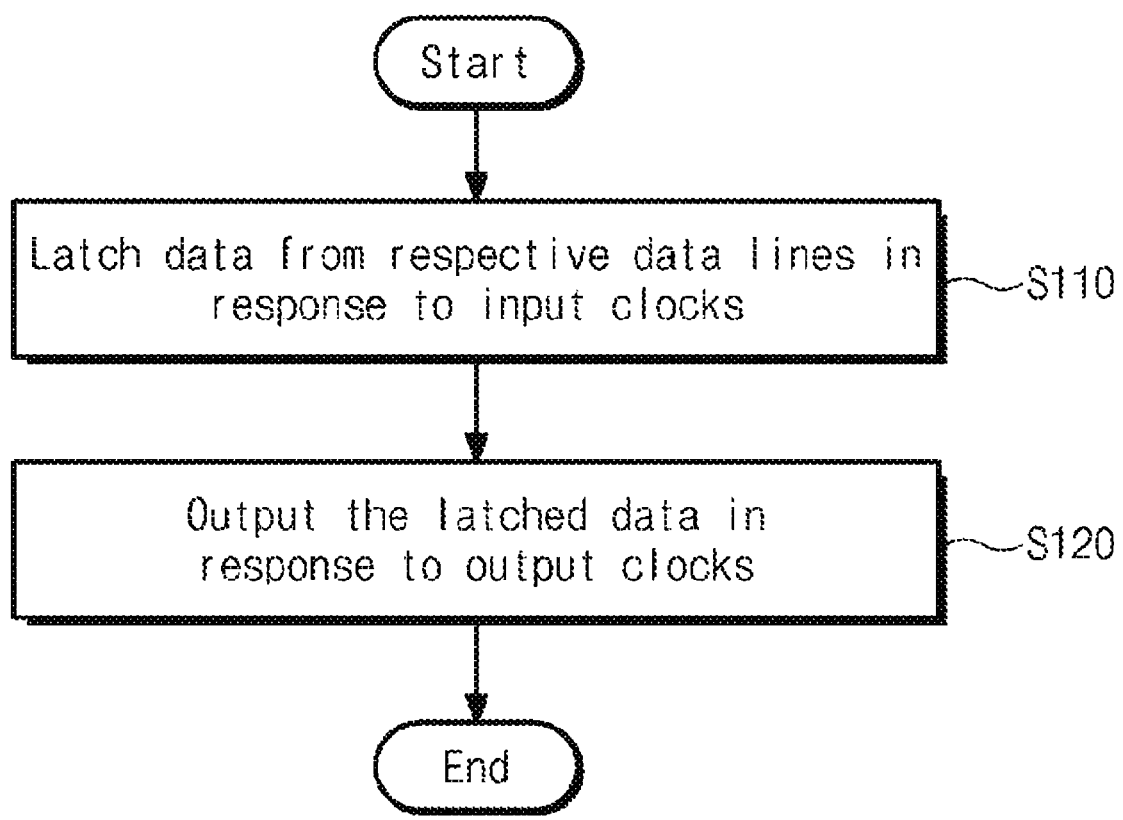
FIG. 12 is a flow chart illustrating a data output method of a nonvolatile memory device according to an embodiment of the inventive concept.

FIG. 12 is a flow chart illustrating a data output method of a nonvolatile memory device according to a first embodiment of the inventive concept. A data output method will be more fully described with reference to FIGS. 1 through 12.

In step S110, data transmitted through data lines DL1 to DLk in a wave pipeline mechanics is sequentially latched in response to data path input clocks FICLK<n:1>. In step S120, the latched data is sequentially output to input/output pads DQ1 to DQk in response to data path output clocks FOCLK<n:1>.

With the data output method of the inventive concept, data latching and outputting operations are performed in an asynchronous manner.

Figure 13:
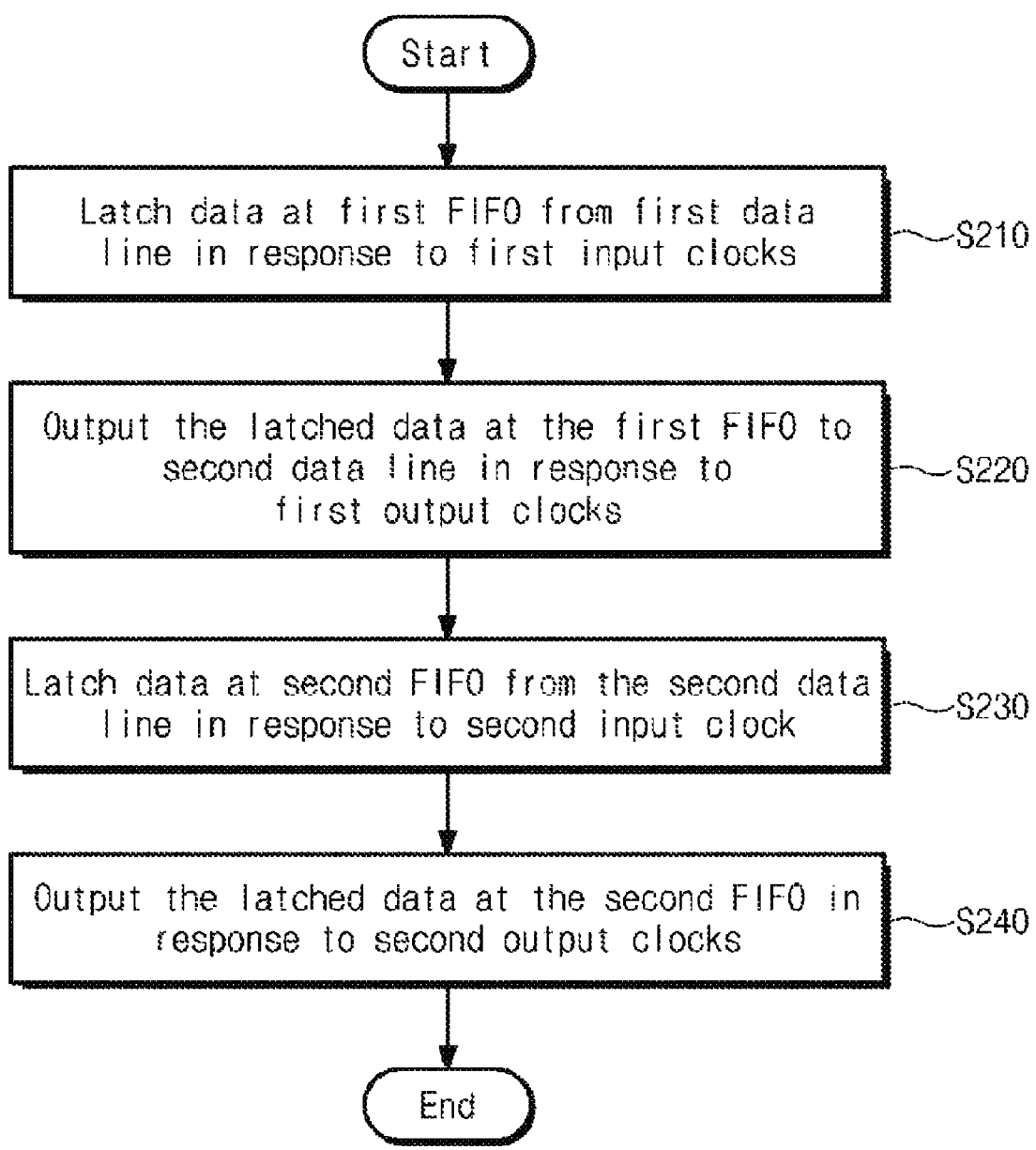
FIG. 13 is a flow chart illustrating a data output method of a nonvolatile memory device according to a second embodiment of the inventive concept.

FIG. 13 is a flow chart illustrating a data output method of a nonvolatile memory device according to a second embodiment of the inventive concept. A data output method will be more fully described with reference to FIGS. 1 through 11 and 13.

In step S210, a first FIFO sequentially latches data from first data lines in response to first data path input clocks. In step S220, the data latched in the first FIFO is sequentially output to second data lines in response to first data path output clocks. In step S230, a second FIFO sequentially latches data from the second data lines in response to second data path input clocks. Here, the second data path input clocks may be produced using the first data path input clocks, and the second data lines may constitute a data bus that is shared in a multi-plane structure. In step S240, the data latched in the second FIFO is sequentially output to input/output pads in response to second data path output clocks.

With the data output method of the inventive concept, data may be output through a plurality of pipeline output stages in an asynchronous way.

Figure 14:
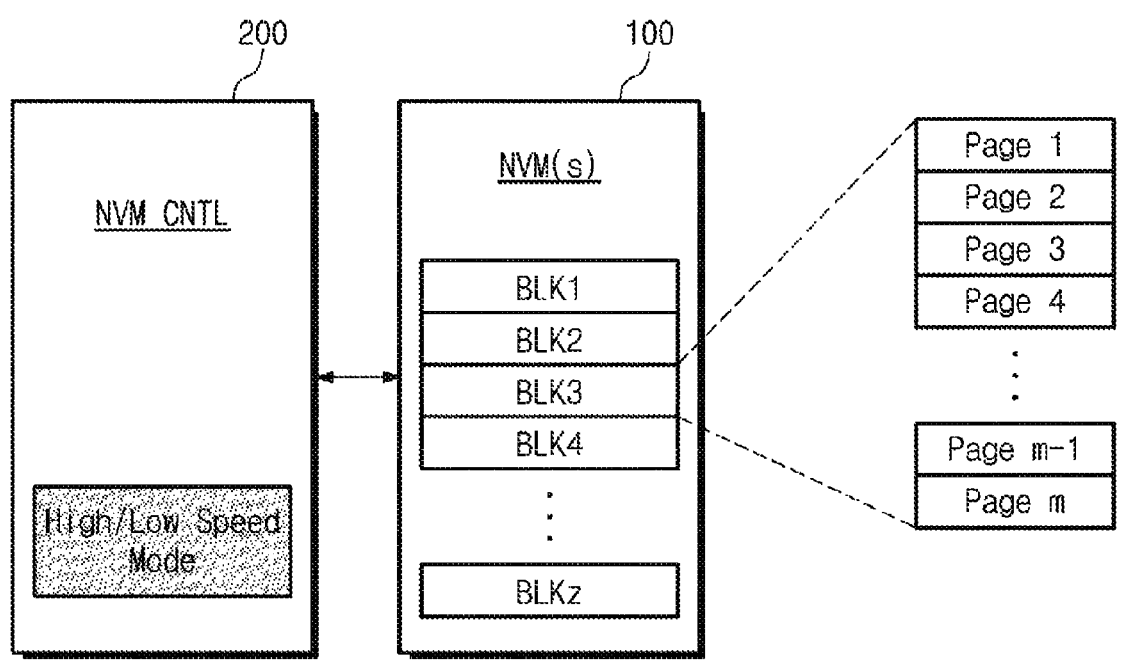
FIG. 14 is a block diagram illustrating a storage device according to another embodiment of the inventive concept.

FIG. 14 is a schematic block diagram illustrating a storage device 10 according to another embodiment of the inventive concept. Referring to FIG. 14, a storage device 10 incorporates at least one nonvolatile memory device 100 and a memory controller 200 controlling the nonvolatile memory device 100. The nonvolatile memory device 100 may be a nonvolatile memory device described with reference to FIGS. 1 through 13. The nonvolatile memory device 100 includes a plurality of memory blocks BLK1 through BLKz (z being an integer of 2 or more). Each of the memory blocks BLK1 through BLKz comprises a plurality of pages Page 1 through Page m (m being an integer of 2 or more).

In exemplary embodiments, the nonvolatile memory device 100 may operate in one of high-speed and low-speed modes according to a request of the memory controller 200.

In exemplary embodiments, the memory controller 200 may select one of high-speed and low-speed modes of operation of the nonvolatile memory device 100 according to a request of an external device (e.g., host) or according to an internal request.

In exemplary embodiments, the memory controller 200 may determine whether to enter a FBC (fail bit count) mode of the nonvolatile memory device 100. For example, the memory controller 200 may decide entrance into the FBC mode of the nonvolatile memory device 100 in a high-speed read mode of operation.

In exemplary embodiments, the memory controller 200 may decide bypass or latency adjustment on at least one of a plurality of pipeline output stages of the nonvolatile memory device 100.

The storage device 10 according to an embodiment of the inventive concept decides an operating mode of the nonvolatile memory device 100 and optimizes a pipeline output stage according to the operating mode thus decided.

Figure 15:
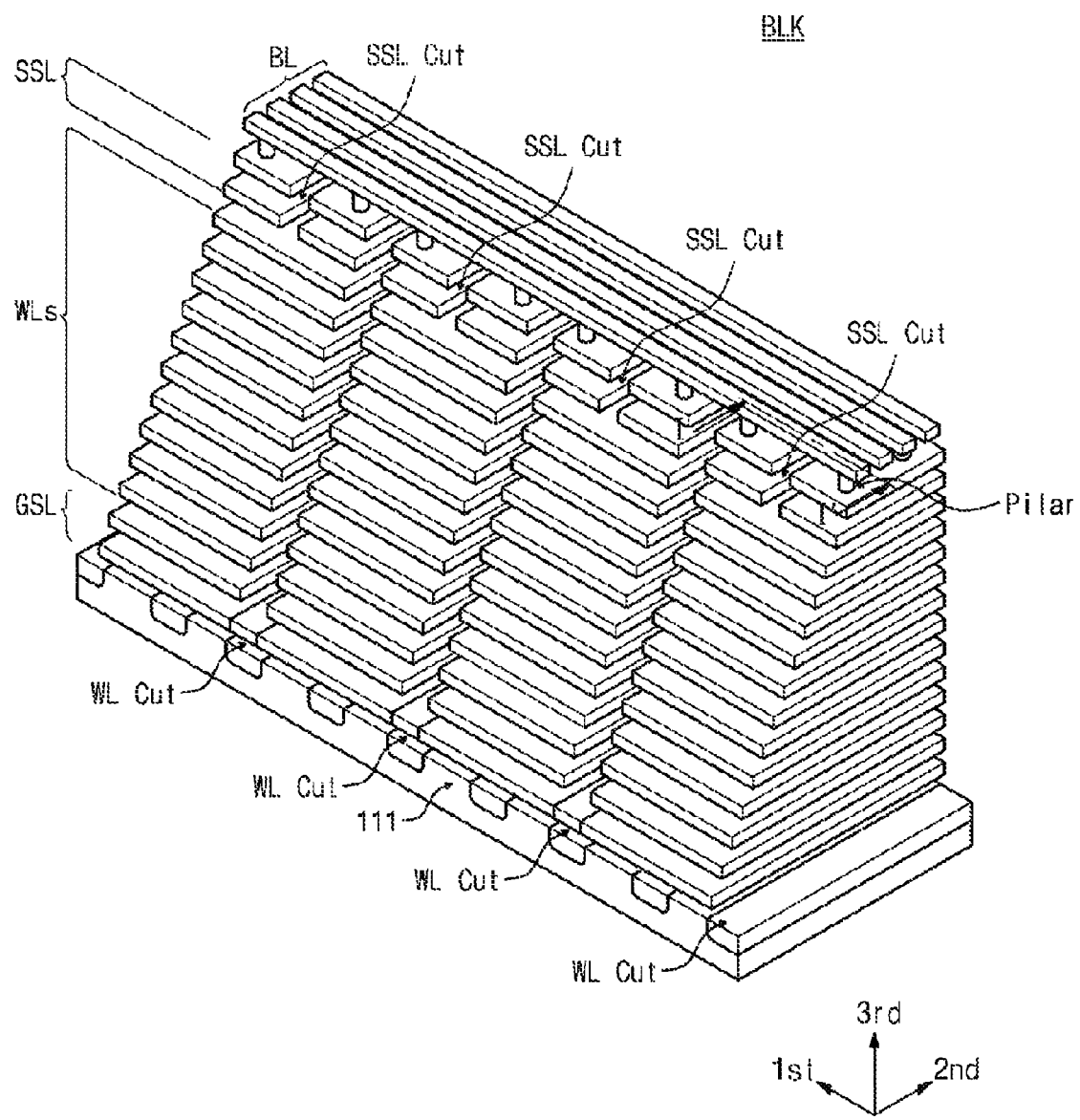
FIG. 15 is a perspective view of a memory block shown in FIG. 14, according to an embodiment of the inventive concept.

FIG. 15 is a perspective view of a memory block BLK shown in FIG. 14, according to an embodiment of the inventive concept. Referring to FIG. 15, four sub blocks are formed on a substrate. Each sub block is formed by stacking and cutting at least one ground selection line GSL, a plurality of word lines, and at least one string selection line SSL on the substrate in a plate shape. Herein, the at least one string selection line SSL is separated by string selection line cuts.

In exemplary embodiments, at least one plate-shaped dummy word line is formed between the ground selection line GSL and the word lines. Or, at least one plate-shaped dummy word line is formed between the word lines and the string selection line SSL.

Although not shown in FIG. 15, each word line cut may include a common source line CSL. In exemplary embodiments, the common source lines CSL included in the word line cuts may be interconnected. A string may be formed by making a pillar connected to a bit line penetrate the at least one string selection line SSL, the word lines, and the at least one ground selection line GSL.

In FIG. 15, an embodiment of the inventive concept is exemplified as a structure between word line cuts adjacent to each other is a sub block. However, the inventive concept is not limited thereto. For example, a structure between a word line cut and a string selection line cut may be defined as a sub block.

The memory block BLK according to an embodiment of the inventive concept may be implemented to have a merged word line structure where two word lines are merged to one.

Figure 16:
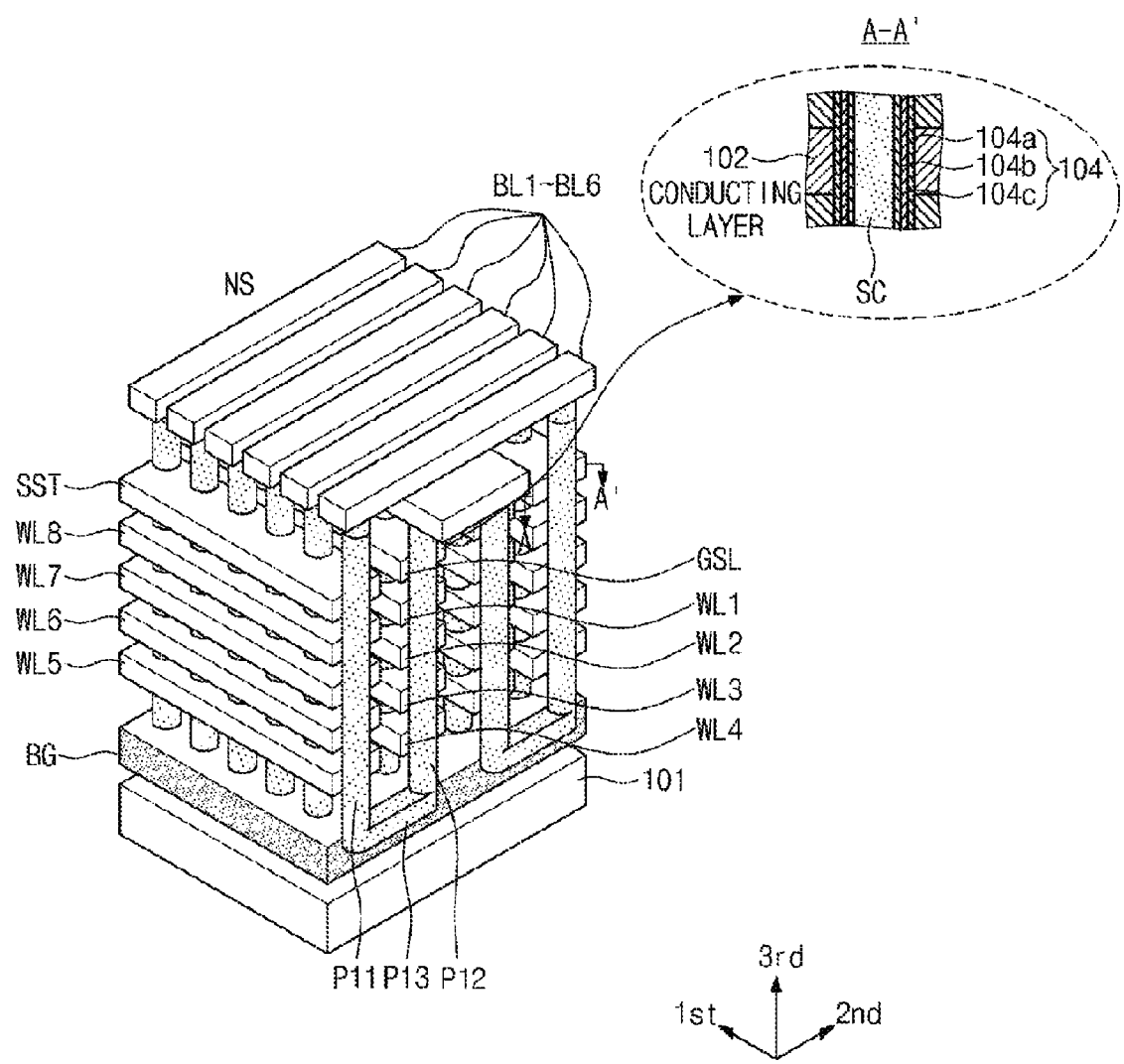
FIG. 16 is a perspective view of a memory block shown in FIG. 14, according to a second embodiment of the inventive concept.

FIG. 16 is a perspective view of a memory block shown in FIG. 14, according to a second embodiment of the inventive concept. For the sake of easy understanding, it is assumed that the number of word line layers is 4. Referring to FIG. 16, a memory block may be implemented to have a PBiCS (pipe-shaped bit cost scalable) structure in which lower ends of adjacent memory cells connected in series are connected through pipes. A memory block may include m-by-n strings NS (n and m being a natural number). In FIG. 16, m=6 and n=2. Each string NS may include memory cells MC1 through MC8 that are connected in series. First upper ends of the memory cells MC1 through MC8 are connected to string selection transistors SST, second upper ends thereof are connected to ground selection transistors GST, and lower ends thereof are connected through pipes.

In each string NS, memory cells are formed to be stacked on a plurality of semiconductor layers. Each string NS may include a first pillar P11, a second pillar P12, and a pillar connection portion P13 connecting the first and second pillars P11 and P12. The first pillar P11 is connected to a bit line (e.g., BL1) and the pillar connection portion P13 and is formed to penetrate a string selection line SSL and word lines WL5 through WL8. The second pillar P12 is connected to a common source line CSL and the pillar connection portion P13 and is formed to penetrate a ground selection line GSL and word lines WL1 through WL4. As illustrated in FIG. 16, each string NS is formed with a U-shaped pillar.

In exemplary embodiments, a back-gate BG is formed on a substrate 101, and the pillar connection portion P13 is embedded in the back-gate BG. In exemplary embodiments, the back-gate BG may be used in common in a block. The back-gate BG may be separated from a back-gate of another block.

Referring to a cross-sectional structure of a memory cell taken along a line A-A', a gate oxide layer 104c, a charge accumulation layer 104b, and an insulation layer (or a blocking layer) 104a are sequentially formed from a surface of a semiconductor layer SC. The insulation layer 104a has a dielectric constant (high-k) greater than the gate oxide layer 104c. Herein, a conduction layer 102 is formed to surround a surface of the blocking layer 104a. The conduction layer 102 is also named a word line as a control gate of a memory cell MC.

Figure 17:
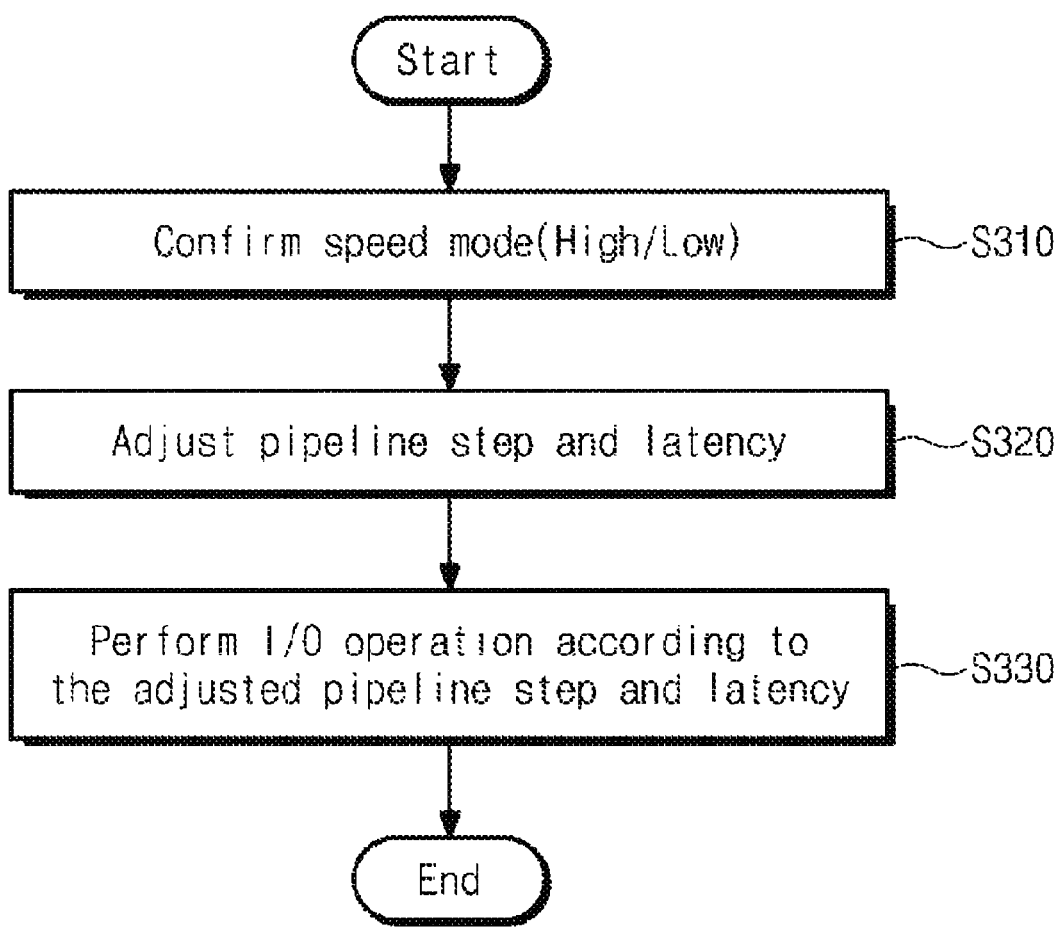
FIG. 17 is a flow chart illustrating an input/output method of a storage device 10 according to an embodiment of the inventive concept.

FIG. 17 is a flow chart illustrating an input/output method of a storage device 10 according to an embodiment of the inventive concept. Below, an input/output method of a storage device 10 will be more fully described with reference to FIGS. 14 and 17.

In step S310, a memory controller 200 confirms a speed mode (high-speed mode/low-speed mode). In step S320, adjusted are a pipeline step, forming at least one data path of a nonvolatile memory device 100, and latency according to the confirmed speed mode. In step S330, an input/output operation is performed according to the adjusted pipeline step and latency.

With the input/output method of the inventive concept, an input/output operation may be optimized by adjusting a pipeline step and latency according to a selected speed mode.

Figure 18:
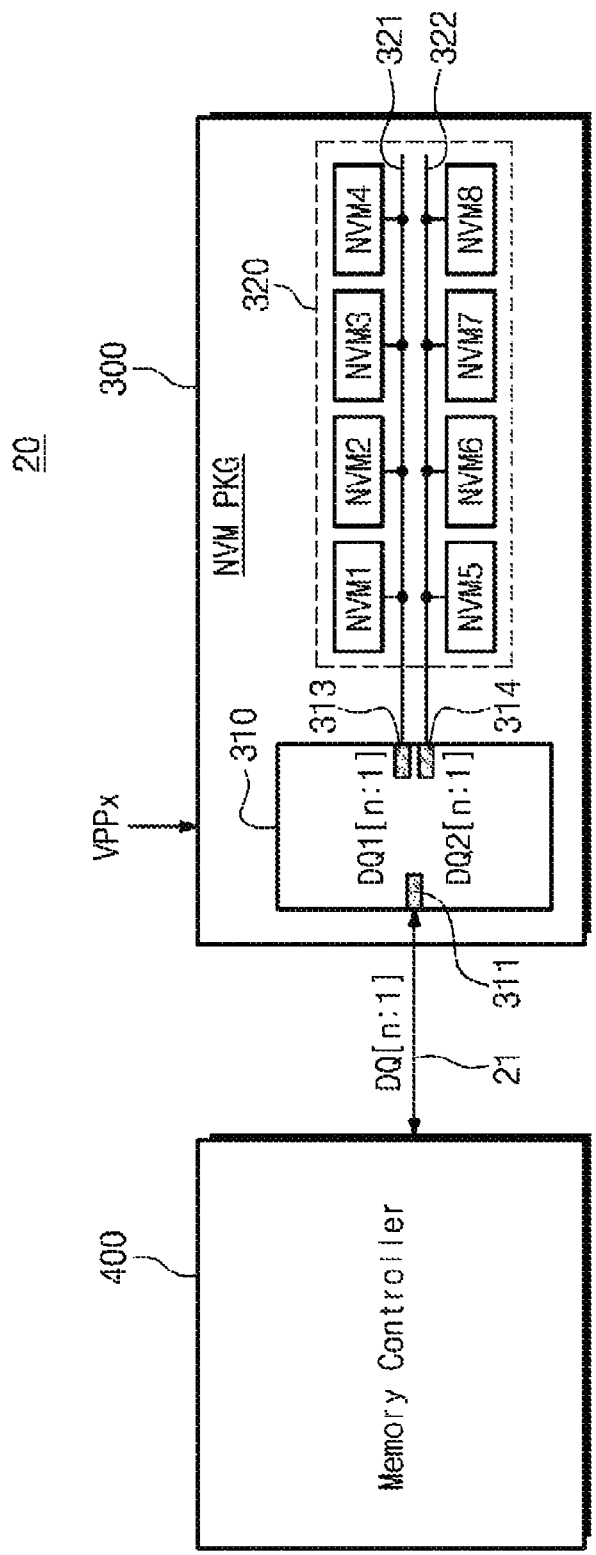
FIG. 18 is a schematic block diagram illustrating a storage device according to another embodiment of the inventive concept.

FIG. 18 is a schematic block diagram illustrating a storage device 20 according to another embodiment of the inventive concept. Referring to FIG. 18, a nonvolatile memory device 20 may include a nonvolatile memory package 300 and a memory controller 400 controlling the nonvolatile memory package 300.

The nonvolatile memory package 300 includes an input/output buffer circuit 310 and a plurality of nonvolatile memory devices NVM1 through NVM8 (320).

When data signals DQ[n:1] (n being an integer of 2 or more) are received through the memory controller 400 and a data channel 21, the input/output buffer circuit 310 selects one of first and second internal data channels 321 and 322. In other words, the input/output buffer circuit 310 receives control signals from the memory controller 400, transmits the control signals to the nonvolatile memory devices 320, and exchanges data signals corresponding to the control signals with the nonvolatile memory devices 320.

In exemplary embodiments, some of the control signals may be signals that the nonvolatile memory devices 320 share. For example, if each of the nonvolatile memory devices 320 is a NAND flash memory, the nonvolatile memory devices 320 may share a command latch enable (CLE), an address latch enable (ALE), and a write enable (WEB).

In exemplary embodiments, some of the control signals may be signals that the nonvolatile memory devices 320 don't share. For example, if each of the nonvolatile memory devices 320 is a NAND flash memory, chip enable signals CE may be provided to the nonvolatile memory devices 320, respectively.

In exemplary embodiments, in a write operation, the data signals DQ[n:1] may be output to either first internal data signals DQ1[$n$:1] or second internal data signals DQ2[$n$:1] through the input/output buffer circuit 310. Herein, the first internal data signals DQ1[$n$:1] are transmitted to first nonvolatile memory devices NVM1 through NVM4 connected to the first internal data channel 321, and the second internal data signals DQ2[$n$:1] are transmitted to second nonvolatile memory devices NVM5 through NVM8 connected to the second internal data channel 322.

In exemplary embodiments, in a read operation, first internal data signals DQ1[$n$:1] read from the first nonvolatile memory devices NVM1 through NVM4 or second internal data signals DQ2[$n$:1] read from the second nonvolatile memory devices NVM5 through NVM8 may be output through the input/output buffer circuit 310 as data signals DQ[n:1].

In exemplary embodiments, the data signals DQ[n:1] are input and output through data pads 311, the first internal data signals DQ1[$n$:1] are input and output through first internal data pads 313 connected to the first internal data channel 321, and the second internal data signals DQ2[$n$:1] are input and output through second internal data pads 314 connected to the second internal data channel 322.

In exemplary embodiments, the input/output buffer circuit 310 may incorporate a pipeline output stage that has a data path based on a wave pipeline architecture.

Each of the nonvolatile memory devices 320 stores data in a write operation and reads data in a read operation. Each of the nonvolatile memory devices 320 is implemented with a nonvolatile memory device described with reference to FIGS. 1 through 17.

The nonvolatile memory devices 320 may include the first nonvolatile memory devices NVM1 through NVM4 connected to the first internal data channel 321 and the second nonvolatile memory devices NVM5 through NVM8 connected to the second internal data channel 322.

In FIG. 18, an embodiment of the inventive concept is exemplified as the number of internal data channels is 2. However, the inventive concept is not limited thereto. For example, the number of internal data channels may be 3 or more. In FIG. 18, an embodiment of the inventive concept is exemplified as four nonvolatile memory devices are connected one internal data channel. However, the inventive concept is not limited thereto. For example, at least two nonvolatile memory devices may be connected to one internal data channel.

Now that the storage device 20 has the input/output buffer circuit 310 for connecting one data channel with one of a plurality of internal data channels 321 and 322 in write and read operations, capacitance of the nonvolatile memory devices seen from the memory controller 400 may be reduced.

A wave pipeline mechanics for a high-speed data transfer is applied to a nonvolatile memory device according to an embodiment of the inventive concept. Also, the nonvolatile memory device supports a FBC (fail bit count) mode in which output data is compared with expected data. In particular, FBC operations on all arrays are performed simultaneously or independently because the nonvolatile memory device is formed of multi-step wave pipelines.

The nonvolatile memory device according to an embodiment of the inventive concept reads data corresponding to one row in response to a read signal and a row address, stores the read data in a page buffer circuit, and sequentially outputs data stored in the page buffer circuit from data, corresponding to an externally received column address, in an asynchronous wave pipeline mechanics in response to an external clock. In particular, compared with a typical pipeline mechanics, a margin point scattered over a chip is markedly reduced because data is output in a wave pipeline mechanics. Thus, it is possible to easily design a data path suitable for a high-speed operation.

Also, a register clock path is shortened by disposing end registers of a pipeline to be clustered on any site, not to be adjacent to respective input/output pins. Thus, it is possible to markedly reduce current and wire consumption.

Further, the FBC mode is perfectly supported by using multi-step wave pipelines.

To overcome data skew among input/output pads, two sets of data lines are configured and data multiplexers are respectively disposed at input/output pads.

The nonvolatile memory device of the inventive concept has a function of bypassing some pipeline output stages or adjusting latency in a low-speed mode.

A chip area is reduced by configuring the nonvolatile memory device such that all arrays share a data bus after a first pipeline output stage.

Figure 19:
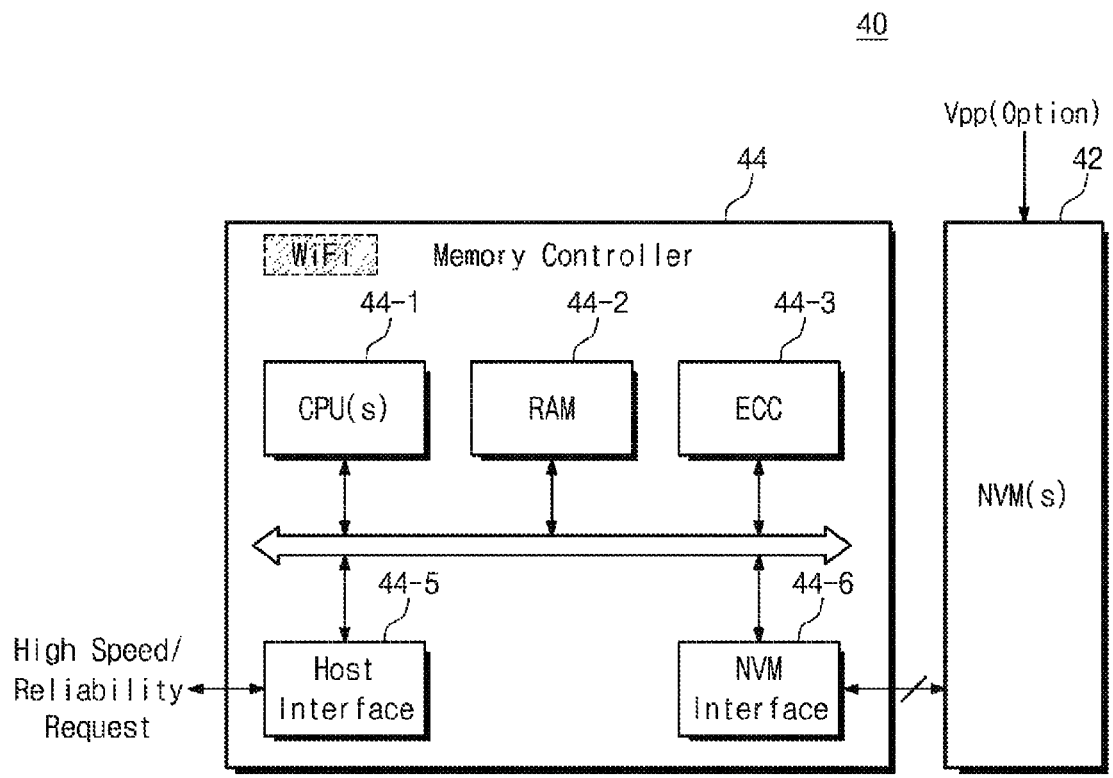
FIG. 19 is a schematic block diagram illustrating a memory system according to an embodiment of the inventive concept.

FIG. 19 is a schematic block diagram illustrating a memory system 40 according to an embodiment of the inventive concept. Referring to FIG. 19, a memory system 40 may include at least one nonvolatile memory device 42 and a memory controller 44 to control the nonvolatile memory device 42. The memory system 40 shown in FIG. 19 may be used as, but not limited to, a storage medium of a memory card (e.g., CF, SD, micro SD, and so on) or an USB storage device.

The nonvolatile memory device 42 may be implemented with a nonvolatile memory device that has a data path based on a wave pipeline architecture described with reference to FIGS. 1 through 18.

The memory controller 44 controls read, write, and erase operations of the nonvolatile memory device 42 in response to a host request. The memory controller 44 may include at least one central processing unit 44-1, a RAM 44-2, an ECC block 44-3, a host interface 44-5, and an NVM interface 44-6.

The central processing unit 44-1 controls an overall operation of the nonvolatile memory device 42 such as writing, reading, management of a file system, management of bad pages, and so on. The RAM 44-2 operates in response to a control of the central processing unit 44-1 and is used as a working memory, a buffer memory, and a cache memory. If the RAM 44-2 is used as a working memory, data processed by the central processing unit 44-1 may be temporarily stored therein. If used as a buffer memory, the RAM 44-2 may be used to buffer data that is transferred from a host to the nonvolatile memory device 42 or from the nonvolatile memory device 42 to the host. As a cache memory, the RAM 44-2 may enable a low-speed nonvolatile memory device 42 to operate at high speed.

The ECC block 44-3 generates an error correction code ECC for correcting a fail bit or an error bit of data received from the nonvolatile memory device 42. The ECC block 44-3 performs error correction encoding on data to be provided to the nonvolatile memory device 42, so parity information is added thereto. The parity information may be stored in the nonvolatile memory device 42. The ECC block 44-3 performs error correction decoding on data output from the nonvolatile memory device 42. The ECC block 44-3 corrects an error using the parity. The ECC block 44-3 corrects an error using LDPC (Low Density Parity Check) code, BCH code, turbo code, RS (Reed-Solomon) code, convolution code, RSC (Recursive Systematic Code), TCM (Trellis-Coded Modulation), BCM (Block Coded Modulation), and so on.

The memory controller 44 exchanges data with the host through the host interface 44-5 and with the nonvolatile memory device 42 through the NVM interface 44-6. The host interface 44-5 may be connected with a host via PATA (Parallel AT Attachment bus), SATA (Serial AT attachment bus), SCSI, USB, PCIe, NAND interface, and so on.

In exemplary embodiments, the memory controller 44 may be equipped with a wireless communication function (e.g., Wi-Fi).

The memory system 40 according to an embodiment of the inventive concept has a wave pipeline architecture data path, making possible to optimize data output performance.

The inventive concept is applicable to a solid state drive (SSD).

Figure 20:
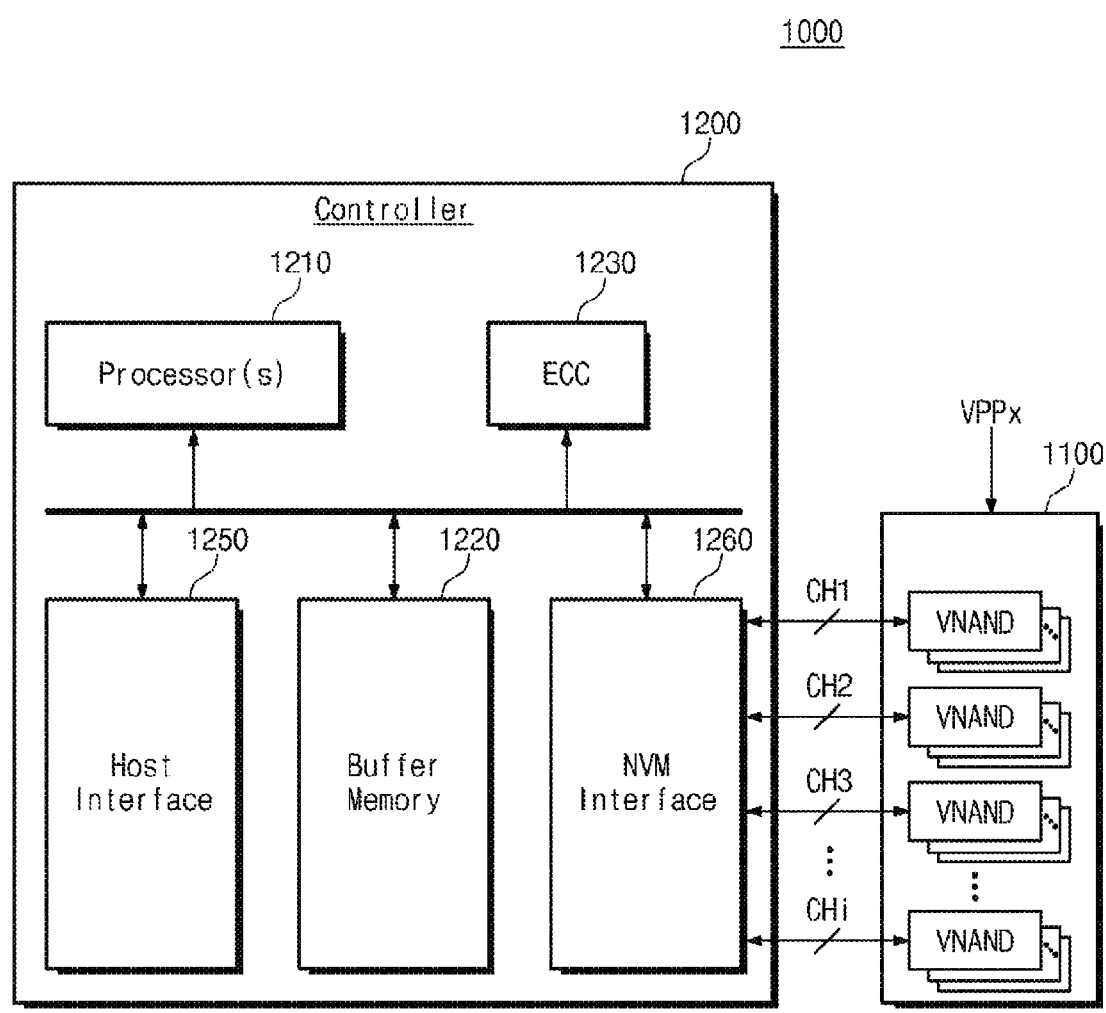
FIG. 20 is a schematic block diagram illustrating a solid state drive according to an embodiment of the inventive concept.

FIG. 20 is a schematic block diagram illustrating a solid state drive according to an embodiment of the inventive concept. Referring to FIG. 20, a solid state drive (hereinafter, referred to as SSD) 1000 includes a plurality of nonvolatile memory devices 1100 and an SSD controller 1200.

The nonvolatile memory devices 1100 are implemented to be provided with an external high voltage VPPx optionally. Each of the nonvolatile memory devices 1100 has a wave pipeline architecture data path described with reference to FIGS. 1 through 18.

The SSD controller 1200 is connected to the nonvolatile memory devices 1100 through a plurality of channels CH1 through CHi (i being an integer of 2 or more). The SSD controller 1200 may be implemented with a memory controller 200 described with reference to FIG. 14. The SSD controller 1200 includes one or more processors 1210, a buffer memory 1220, an ECC block 1230, a host interface 1250, and a nonvolatile memory interface 1260.

The buffer memory 1220 temporarily stores data needed to drive the SSD controller 1200. In exemplary embodiments, the buffer memory 1220 may include a plurality of memory lines each of which stores data or a command. The ECC block 1230 is configured to calculate an ECC value of data to be programmed in a write operation, correct an error of read data according to an ECC value in a read operation, and correct an error of data restored from the nonvolatile memory device 1100 in a data restoration operation. Although not shown in FIG. 20, a code memory may be further included to store code data needed to drive the SSD controller 1200. The code memory may be implemented with a nonvolatile memory device.

The host interface 1250 provides an interface with an external device. The host interface 1250 may be a NAND flash interface. Besides, the host interface 1250 may be implemented with various interfaces or with a plurality of interfaces. The nonvolatile memory interface 1260 provides an interface with the nonvolatile memory devices 1100.

Now that the SSD 100 according to an embodiment of the inventive concept performs a wave pipeline function in a data output operation, it is possible to perform an operation at high speed.

The inventive concept is applicable to an eMMC (e.g., an embedded multimedia card, moviNAND®, iNAND®, etc.).

Figure 21:
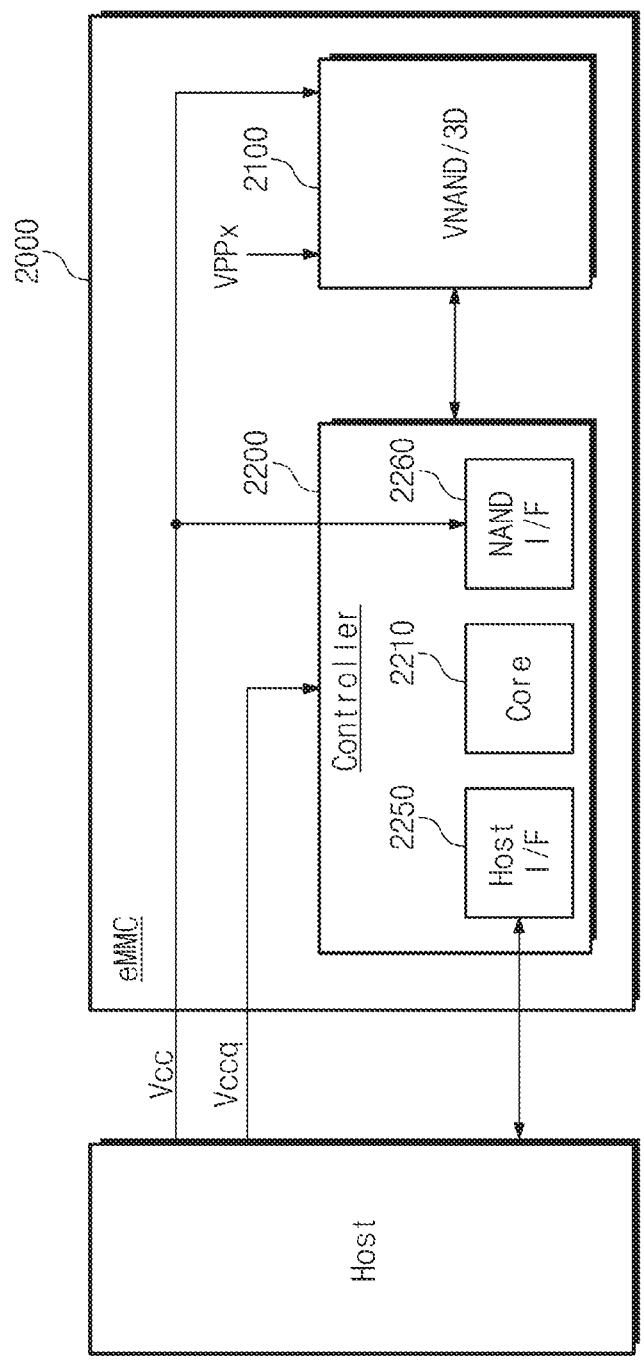
FIG. 21 is a schematic block diagram illustrating an eMMC according to an embodiment of the inventive concept.

FIG. 21 is a schematic block diagram illustrating an eMMC according to an embodiment of the inventive concept. Referring to FIG. 21, an eMMC 2000 includes one or more NAND flash memory devices 2100 and a controller 2200.

The NAND flash memory devices 2100 may be implemented with a nonvolatile memory device 100 described with reference to FIGS. 1 and 18. The controller 2200 is connected to the NAND flash memory device 2100 via a plurality of channels. The controller 2200 includes one or more controller cores 2210, a host interface 2250, and a NAND interface 2260. The controller core 2210 may control an overall operation of the eMMC 2000. The host interface 2250 is configured to perform an interface between the controller 2200 and a host. The NAND interface 2260 is configured to provide an interface between the NAND flash memory device 2100 and the controller 2200. In exemplary embodiments, the host interface 2250 may be a parallel interface (e.g., MMC interface). In other exemplary embodiments, the host interface 2250 of the eMMC 2000 may be a serial interface (e.g., UHS-II, UFS interface, etc.). As another example, the host interface 2250 may be a NAND interface.

The eMMC 2000 receives power supply voltages Vcc and Vccq from the host. Herein, the power supply voltage Vcc (e.g., about 3.3 V) may be supplied to the NAND flash memory device 2100 and the NAND interface 2260, and the power supply voltage Vccq (e.g., about 1.8 V/3.3 V) may be supplied to the controller 2200. In exemplary embodiments, the eMMC 2000 may be optionally supplied with an external high voltage.

The eMMC 2000 according to an embodiment of the inventive concept has a plurality of pipeline output stages and a FBC function. Thus, reliability of data is improved together with a high-speed operation.

The inventive concept is applicable to Universal Flash Storage UFS.

Figure 22:
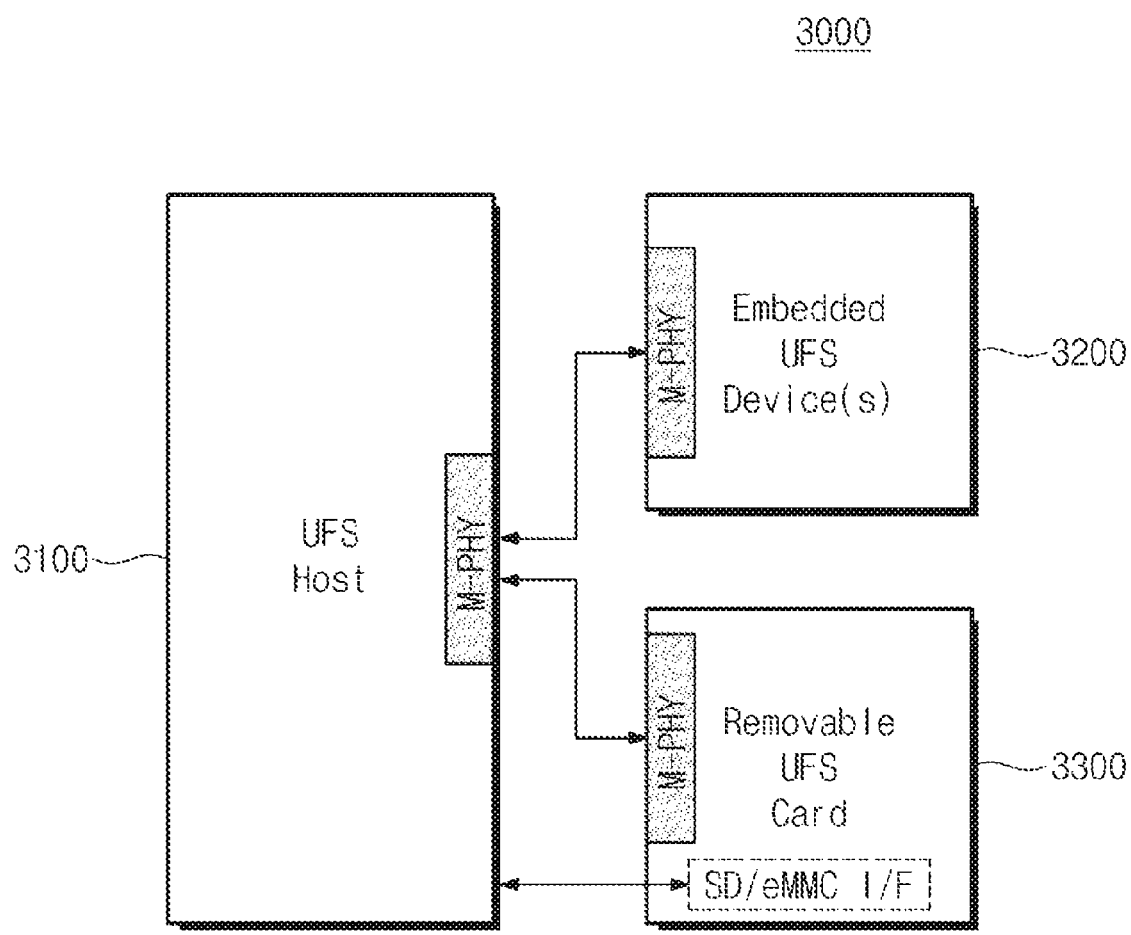
FIG. 22 is a schematic block diagram illustrating a UFS system according to an embodiment of the inventive concept.

FIG. 22 is a schematic block diagram illustrating a UFS system according to an embodiment of the inventive concept. Referring to FIG. 22, a UFS system 3000 includes a UFS host 3100, an embedded UFS device 3200, and a removable UFS card 3300. Communication between the UFS host 3100 and the embedded UFS device 3200 and communication between the UFS host 3100 and the removable UFS card 3300 may be performed through M-PHY layers.

At least one of the embedded UFS device 3200 and the removable UFS card 3300 may be implemented to have data paths formed of a plurality of pipeline output stages.

Meanwhile, the host 3100 includes a bridge that enables the removable UFS card 3300 to communicate using the protocol different from the UFS protocol. The UFS host 3100 and the removable UFS card 3300 may communicate through various card protocols (e.g., UFDs, MMC, SD (secure digital), mini SD, Micro SD®, etc.).

The inventive concept is applicable to a mobile device.

Figure 23:
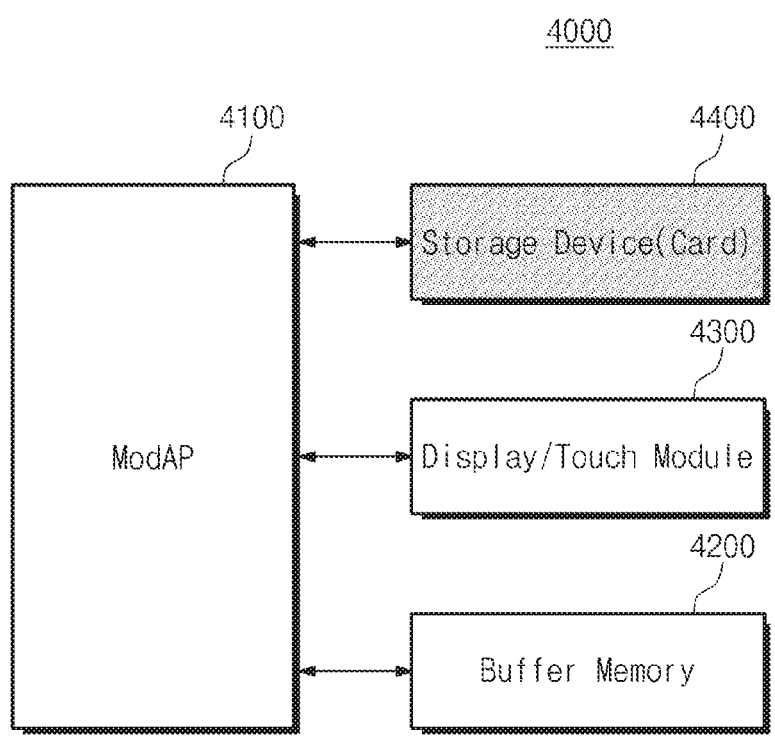
FIG. 23 is a schematic block diagram illustrating a mobile device according to an embodiment of the inventive concept.

FIG. 23 is a schematic block diagram illustrating a mobile device 4000 according to an embodiment of the inventive concept. Referring to FIG. 23, a mobile device 4000 includes an integrated processor 4100, a buffer memory 4200, a display/touch module 4300, and a storage device 4400.

The integrated processor 4100 controls an overall operation of the mobile device 4000 and wireless/wire communications with an external device. The buffer memory 4200 is configured to store data needed to perform a processing operation of the mobile device 4000. The display/touch module 4300 is implemented to display data processed by the integrated processor 4100 or to receive data through a touch panel. The storage device 4400 is implemented to store user data. The storage device 4400 may be, but not limited to, a memory card, an eMMC, an SSD, or an UFS device. The storage device 4400 may be implemented to have a plurality of pipeline output stages and a FBC function and share a data bus as described with reference to FIGS. 1 through 18.

The mobile device 4000 according to an embodiment of the inventive concept is advantageous to a high-speed operation and a scaled-down chip size.

With the inventive concept, a data output operation is performed in an asynchronous way and a data input operation is performed in a synchronous way.

A memory system and/or a storage device according to the inventive concept may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:
1. A nonvolatile memory device comprising:
   a three-dimensional memory cell array;
   a plurality of page buffers connected to the memory cell array through bit lines; and
   a pipeline output stage connected to the plurality of page buffers through data lines, wherein the pipeline output stage comprises:
a plurality of first pipeline output stages each including a plurality of first registers connected to the plurality of page buffers in a wave pipeline architecture;
a data multiplexer connected to each of the plurality of first pipeline output stages and configured to select and transmit data output from one of the plurality of first pipeline output stages; and
at least one second pipeline output stage connected to an output of the data multiplexer in the wave pipeline architecture, the at least one second pipeline output stage including a plurality of second registers configured to store the data transmitted from the data multiplexer.

2. The nonvolatile memory device of claim 1, further comprising:
compare logics connected between the first pipeline output stages and the data multiplexer and configured to compare output data of the first pipeline output stages with expected data.

3. The nonvolatile memory device of claim 2, wherein each of the compare logics checks integrity of data transmitted to at least one of the data lines.

4. The nonvolatile memory device of claim 2, wherein the at least one second pipeline output stage is connected to input/output pads.

5. The nonvolatile memory device of claim 4, wherein the plurality of second registers are disposed to be scattered at the input/output pads.

6. The nonvolatile memory device of claim 4, wherein the plurality of second registers are disposed to be clustered at one of the input/output pads.

7. The nonvolatile memory device of claim 4, further comprising:
a second data multiplexer connected to the input/output pads and configured to receive data through data lines separated from registers of second pipeline output stages from among the at least one second pipeline output stage and transmit one of the received data to the input/output pads in response to a multiplexing control signal.

8. The nonvolatile memory device of claim 1, further comprising:
an internal clock generator configured to use an external clock to generate an internal clock during a time interval corresponding to a latency of the pipeline output stage.

9. The nonvolatile memory device of claim 8, further comprising:
at least one latency counter configured to count a latency of the internal clock; and
a clock multiplexer configured to use one of output clocks from the first pipeline output stages as an input clock of the at least one second pipeline output stage.

10. The nonvolatile memory device of claim 8, further comprising:
a clock input selector configured to determine whether to provide the internal clock to one of the first pipeline output stages, based on an array selection signal.

* * * * *